US 8,303,724 B2

United States Patent
Hiroshiro et al.

(10) Patent No.: US 8,303,724 B2
(45) Date of Patent: *Nov. 6, 2012

(54) SUBSTRATE PROCESSING METHOD AND NON-TRANSITORY STORAGE MEDIUM FOR CARRYING OUT SUCH METHOD

(75) Inventors: Koukichi Hiroshiro, Tosu (JP); Yuji Kamikawa, Tosu (JP); Takayuki Toshima, Koshi (JP); Naoki Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/206,186

(22) Filed: Aug. 9, 2011

(65) Prior Publication Data

US 2011/0290280 A1    Dec. 1, 2011

Related U.S. Application Data

(62) Division of application No. 11/922,502, filed as application No. PCT/JP2006/312102 on Jun. 16, 2006, now Pat. No. 8,015,984.

(30) Foreign Application Priority Data

Jun. 22, 2005 (JP) ................................. 2005-182320
Jun. 22, 2005 (JP) ................................. 2005-182321

(51) Int. Cl.
*B08B 3/00* (2006.01)
(52) U.S. Cl. ...... 134/26; 134/56 R; 134/95.2; 134/100.1
(58) Field of Classification Search ................. 134/26, 134/56 R, 95.2, 100.1
See application file for complete search history.

(56) References Cited

U.S. PATENT DOCUMENTS

| 5,575,079 | A | 11/1996 | Yokomizo et al. |
| 5,716,458 | A | 2/1998 | Machino |
| 5,956,859 | A | 9/1999 | Matsumoto et al. |
| 6,068,002 | A | 5/2000 | Kamikawa et al. |
| 2003/0159713 | A1 | 8/2003 | Park et al. |
| 2005/0091874 | A1 | 5/2005 | Chen et al. |
| 2007/0227032 | A1 | 10/2007 | Kimura |

FOREIGN PATENT DOCUMENTS

| JP | 63-23326 | 1/1988 |
| JP | 4-122024 | 4/1992 |
| JP | 8-211592 | 8/1996 |
| JP | 11-176798 | 7/1999 |
| JP | 2000-40686 | 2/2000 |
| JP | 2002-280353 | 9/2002 |
| JP | 2003-243351 | 8/2003 |

*Primary Examiner* — Michael Barr
*Assistant Examiner* — Charles W Kling
(74) *Attorney, Agent, or Firm* — Smith, Gambrell & Russell, LLP

(57) ABSTRACT

Disclosed is a substrate processing apparatus for cleaning and drying a substrate such as a semiconductor wafer. This substrate processing apparatus includes a liquid processing unit for processing a substrate by immersing the substrate in stored purified water, a drying unit arranged above the liquid processing unit and configured to dry the substrate, a substrate transfer apparatus for transferring the substrate between the liquid processing unit and drying unit, a fluid supply mechanism for supplying a fluid mixture containing vapor or mist of purified water and vapor or mist of a volatile organic solvent to the drying unit, and a controller for controlling the supply of the fluid mixture.

10 Claims, 10 Drawing Sheets

SUBSTRATE PROCESSING METHOD AND NON-TRANSITORY STORAGE MEDIUM FOR CARRYING OUT SUCH METHOD

CROSS REFERENCE TO RELATED APPLICATION

This application is a division of Ser. No. 11/922,502, filed Dec. 19, 2007, which is a 371 National Phase entry of PCT/JP2006/312102, filed Jun. 16, 2006 and claims the benefit of JP 2005-182321, filed Jun. 22, 2005 and JP 2005-182320, also filed Jun. 22, 2005, all of which are being incorporated in their entirety herein by reference.

TECHNICAL FIELD

The present invention relates to a substrate processing apparatus and substrate processing method for cleaning and drying a substrate such as a semiconductor wafer, and a computer readable storage medium used to control the substrate processing apparatus in order to execute the substrate processing method.

BACKGROUND ART

The semiconductor device fabrication process uses various cleaning methods of cleaning a semiconductor wafer (to be referred to as "a wafer" hereinafter). A known example is a method of processing a wafer by immersing it in a processing bath containing a chemical solution such as dilute hydrofluoric acid (DHF), rinsing the processed wafer by immersing it in a processing bath containing purified water, immersing the rinsed wafer in a processing bath containing isopropyl alcohol (IPA), and drying the wafer by using the marangoni effect by slowly pulling up the wafer from this processing bath or discharging IPA from the processing bath (e.g., Patent Documents 1 and 2).

Recently, however, the micropatterning of a circuit pattern formed on a wafer is advancing, and the strength of a projection of the pattern has decreased. If a wafer having a circuit pattern like this formed on it is processed by the above processing method, therefore, the formed pattern (projection) falls in the drying process.

This pattern fall presumably occurs because if the projection of the circuit pattern exists in the boundary between a gas phase and liquid phase when the wafer is pulled up from the IPA processing bath (or when IPA is drained from the IPA processing bath), the magnitude of a force acting on the projection loses its balance due to the surface tension of IPA between the gas phase side and liquid phase side of the projection.

Another known example of the wafer cleaning method is to process a wafer by immersing it in a processing bath containing a chemical solution such as dilute hydrofluoric acid (DHF), rinse the processed wafer by immersing it in a processing bath containing purified water, and dry the rinsed wafer pulled up from the processing bath by supplying vapor of isopropyl alcohol (IPA) to the wafer.

In this substrate drying method, the wafer temperature rises when the IPA vapor condenses on the surface of the wafer, and IPA sticking to the wafer volatizes after that due to this temperature rise. In this case, a watermark is formed by the evaporation of purified water if there is a portion where purified water sticking to the wafer is not well replaced with IPA.

A known processing method that suppresses the formation of this watermark is to use an apparatus capable of storing purified water in a water bath, forming a layer of water vapor within a predetermined range above the water surface, and also forming a layer of IPA vapor above the water vapor layer, and pull up a wafer immersed in the purified water toward the IPA vapor layer (e.g., Patent Document 3).

Unfortunately, the strength of projections forming circuit patterns has decreased with the recent progress of micropatterning of circuit patterns. When a wafer is processed by this processing method, therefore, in a projection positioned near the boundary between the water vapor layer and IPA vapor layer, drying by the IPA vapor has started in the upper portion of the projection, whereas the water film formed by the water vapor remains in the lower portion of the projection. This makes the magnitude of the surface tension acting on this projection on the side above the boundary between the water vapor layer and IPA vapor layer different from that on the side below the boundary. As a consequence, the projection may fall.

Patent Document 1: Jpn. Pat. Appln. KOKAI Publication No. 63-23326
Patent Document 2: Jpn. Pat. Appln. KOKAI Publication No. 2003-243351
Patent Document 3: Jpn. Pat. Appln. KOKAI Publication No. 11-176798

DISCLOSURE OF INVENTION

It is an object of the present invention to provide a substrate processing apparatus and substrate processing method capable of suppressing the fall of a pattern formed on a substrate when the substrate is transferred from liquid processing to a drying process.

It is another object of the present invention to provide a substrate processing apparatus and substrate processing method capable of suppressing the fall of a pattern formed on a substrate, and also capable of suppressing the formation of a watermark, when the substrate is transferred from liquid processing to a drying process.

It is still another object of the present invention to provide a computer readable storage medium for executing the above substrate processing method.

According to a first aspect of the present invention, there is provided a substrate processing apparatus comprising: a liquid processing mechanism which performs liquid processing by bringing purified water into contact with a surface of a substrate; a fluid supply mechanism which supplies a fluid mixture containing purified water and a volatile organic solvent to the surface of the substrate in order to dry the substrate; and a controller which controls the supply of the fluid mixture.

In the apparatus of the first aspect, the controller may control a concentration of the volatile organic solvent in the fluid mixture. In this case, the controller may control the fluid supply mechanism such that the concentration of the volatile organic solvent in the fluid mixture supplied from the fluid supply mechanism to the substrate continuously or gradually rises with time. Specifically, the controller may perform control such that the concentration of the volatile organic solvent in the fluid mixture supplied from the fluid supply mechanism to the substrate is initially not more than 40% and finally not less than 90%.

According to a second aspect of the present invention, there is provided a substrate processing apparatus comprising: a liquid processing unit which processes a substrate by immersing the substrate in stored purified water; a drying unit arranged above the liquid processing unit and configured to dry the substrate; a substrate transfer apparatus which transfers the substrate between the liquid processing unit and the drying unit; a fluid supply mechanism which supplies a fluid mixture containing vapor or mist of purified water and vapor or mist of a volatile organic solvent to the drying unit; and a controller which controls the supply of the fluid mixture.

In the apparatus of the second aspect, the controller may control the substrate transfer mechanism and the fluid supply mechanism such that the substrate immersed in the purified water stored in the liquid processing unit is pulled up toward the drying unit, and the fluid mixture is supplied to the drying unit after a lower end of the substrate has emerged from a surface of the purified water. The controller may control the fluid supply mechanism such that the supply of the vapor or mist of the purified water to the drying unit is stopped after an elapse of a predetermined time from the start of the supply of the fluid mixture to the drying unit. The controller may control the substrate transfer apparatus and the fluid supply mechanism such that after the supply of the fluid mixture to the drying unit is started, the substrate immersed in the purified water stored in the liquid processing unit is pulled up toward the drying unit while the supply of the fluid mixture is continued. In this case, the controller may control the fluid supply mechanism such that when pulling up the substrate immersed in the purified water stored in the liquid processing unit toward the drying unit, the supply of the vapor or mist of the purified water to the drying unit is stopped after a lower end of the substrate has emerged from a surface of the stored purified water.

In the apparatus of the second aspect, the apparatus may further comprise a shutter adapted to isolate the liquid processing unit and the drying unit from each other, wherein the controller may control the shutter and the fluid supply mechanism such that the shutter isolates the liquid processing unit and the drying unit from each other after the substrate immersed in the purified water stored in the liquid processing unit is completely pulled up to the drying unit, and the supply of the vapor or mist of the purified water to the drying unit is stopped thereafter.

The controller may control a concentration of the volatile organic solvent in the fluid mixture. In this case, the controller may control the fluid supply mechanism such that the concentration of the volatile organic solvent in the fluid mixture supplied from the fluid supply mechanism to the drying unit continuously or gradually rises with time. The controller may control the fluid supply mechanism such that the concentration of the volatile organic solvent in the fluid mixture supplied from the fluid supply mechanism to the drying unit continuously or gradually rises with time by continuously or gradually reducing the supply of the vapor or mist of the purified water to the drying unit before stopping the supply. In this case, the controller may control the fluid supply mechanism such that the concentration of the volatile organic solvent in the fluid mixture supplied from the fluid supply mechanism to the drying unit is initially not more than 40% and finally not less than 90%.

In the apparatus of the second aspect, the apparatus may further comprise a gas supply mechanism which supplies a heated inert gas to the drying unit, wherein the controller may control the fluid supply mechanism and the gas supply mechanism such that the supply of the vapor or mist of the volatile organic solvent to the drying unit is stopped a predetermined time after the supply of the vapor or mist of the purified water to the drying unit is stopped, and the heated inert gas is supplied to the drying unit thereafter.

According to a third aspect of the present invention, there is provided a substrate processing method comprising: cleaning a substrate with purified water; and supplying a fluid mixture containing vapor or mist of purified water and vapor or mist of a volatile organic solvent to a drying unit in order to dry the substrate.

In the method of the third aspect, the method may further comprise changing a concentration of the volatile organic solvent in the fluid mixture. Changing the concentration of the volatile organic solvent in the fluid mixture may comprise continuously or gradually raising the concentration of the volatile organic solvent in the fluid mixture with time. In this case, in changing the concentration of the volatile organic solvent in the fluid mixture, the concentration of the volatile organic solvent in the fluid mixture may be initially not more than 40% and finally not less than 90%. The volatile organic solvent may comprise isopropyl alcohol (IPA).

According to a fourth aspect of the present invention, there is provided a substrate processing method comprising: cleaning a substrate by immersing the substrate in purified water stored in a liquid processing unit; transferring the substrate to a drying unit arranged above the liquid processing unit to communicate with the liquid processing unit; and supplying, to the drying unit, a fluid mixture containing vapor or mist of purified water and vapor or mist of a nonvolatile organic solvent in order to dry the substrate.

In the method of the fourth aspect, supplying the fluid mixture may be performed immediately after a lower end of the substrate has emerged from a surface of the purified water stored in the liquid processing unit. Supplying the fluid mixture may be performed before or at the same time the transfer of the substrate to the transfer unit is started, and may comprise transferring the substrate to the drying unit while the supply of the fluid mixture is continued.

In the method of the fourth aspect, the method may further comprise: stopping the supply of the vapor or mist of the purified water to the drying unit; and stopping the supply of the vapor or mist of the nonvolatile organic solvent to the drying unit. The method may further comprise supplying a heated dry gas to the substrate in order to evaporate the volatile organic solvent on a surface of the substrate. The method may further comprise isolating the liquid processing unit and the drying unit from each other after the substrate is accommodated in the drying unit.

In the method of the fourth aspect, the method may further comprise changing a concentration of the volatile organic solvent in the fluid mixture. In this case, changing the concentration of the volatile organic solvent in the fluid mixture may comprise continuously or gradually raising the concentration of the volatile organic solvent in the fluid mixture with time. Changing the concentration of the volatile organic solvent in the fluid mixture may comprise continuously or gradually raising the concentration of the volatile organic solvent in the fluid mixture with time by continuously or gradually reducing the supply of the vapor or mist of the purified water to the drying unit before stopping the supply. In changing the concentration of the volatile organic solvent in the fluid mixture, the concentration of the volatile organic solvent in the fluid mixture may be initially not more than 40% and finally not less than 90%. The volatile organic solvent may comprise isopropyl alcohol (IPA).

According to a fifth aspect of the present invention, there is provided a computer readable storage medium storing a control program operating on a computer, the control program causing, when executed, the computer to control a substrate processing apparatus to execute a substrate processing method comprising cleaning a substrate with purified water, and supplying a fluid mixture containing vapor or mist of purified water and vapor or mist of a volatile organic solvent to the drying unit in order to dry the substrate.

According to a sixth aspect of the present invention, there is provided a computer readable storage medium storing a control program operating on a computer, the control program causing, when executed, the computer to control a substrate processing apparatus to execute a substrate processing method comprising cleaning a substrate by immersing the substrate in purified water stored in a liquid processing unit, transferring the substrate to a drying unit arranged above the liquid processing unit to communicate with the liquid processing unit, and supplying a fluid mixture containing vapor or mist of purified water and vapor or mist of a nonvolatile organic solvent to the drying unit in order to dry the substrate.

In the storage medium of the fifth or sixth aspect, the substrate processing method executed by the control program further may comprise changing a concentration of the volatile organic solvent in the fluid mixture.

According to a seventh aspect of the present invention, there is provided a substrate processing apparatus comprising: a liquid processing unit which processes a substrate by immersing the substrate in stored purified water; a drying unit arranged to communicate with the liquid processing unit, and configured to dry the substrate; a substrate transfer apparatus which transfers the substrate between the liquid processing unit and the drying unit; uniformizing means for substantially uniformizing, within a range of a surface of the substrate transferred to a predetermined position of the drying unit, a liquid film sticking to the surface of the substrate; and simultaneous drying means for drying the substrate substantially simultaneously over the surface.

In the apparatus of the seventh aspect, the uniformizing means may comprise a purified water supply mechanism which supplies vapor or mist of purified water to the drying unit, and adheres the vapor or mist of the purified water to the substrate surface when the substrate is transferred to the drying unit. The simultaneous drying means may comprise a volatile organic solvent supply mechanism which supplies vapor or mist of a volatile organic solvent to the drying unit, and may be adapted to supply the vapor or mist of the volatile organic solvent substantially simultaneously to the substrate surface on which the liquid film of the purified water is formed. The apparatus may further comprise a gas supply mechanism which supplies a heated inert gas to the drying unit.

According to an eighth aspect of the present invention, there is provided a substrate processing apparatus comprising: a liquid processing unit which processes a substrate by immersing the substrate in stored purified water; a drying unit arranged to communicate with the liquid processing unit, and configured to dry the substrate; a substrate transfer apparatus which transfers the substrate between the liquid processing unit and the drying unit; a purified water supply mechanism which supplies vapor or mist of purified water to the drying unit; an organic solvent supply mechanism which supplies vapor or mist of a volatile organic solvent to the drying unit; and a controller which, when transferring the substrate immersed in the purified water stored in the liquid processing unit to the drying unit, controls the substrate transfer apparatus, the purified water supply mechanism, and the organic solvent supply mechanism to start the supply of the vapor or mist of the purified water to the drying unit at a predetermined timing from the timing at which the substrate is immersed in the purified water stored in the liquid processing unit to the timing at which the substrate is transferred to a predetermined position of the drying unit, stop the supply of the vapor or mist of the purified water to the drying unit after the substrate is transferred to the predetermined position of the drying unit, and start the supply of the vapor or mist of the volatile organic solvent to the drying unit thereafter.

According to a ninth aspect of the present invention, there is provided a substrate processing apparatus comprising: a liquid processing unit which processes a substrate by immersing the substrate in stored purified water; a drying unit arranged to communicate with the liquid processing unit, and configured to dry the substrate; a substrate transfer apparatus which transfers the substrate between the liquid processing unit and the drying unit; a purified water supply mechanism which supplies vapor or mist of purified water to the drying unit; an organic solvent supply mechanism which supplies vapor or mist of a volatile organic solvent to the drying unit; and a controller which, when pulling up the substrate immersed in the purified water stored in the liquid processing unit to the drying unit, controls the substrate transfer apparatus, the purified water supply mechanism, and the organic solvent supply mechanism to start the supply of the vapor or mist of the purified water to the drying unit at a predetermined timing from the timing at which the substrate is immersed in the purified water stored in the liquid processing unit to the timing at which the substrate is transferred to a predetermined position of the drying unit, start the supply of the vapor or mist of the volatile organic solvent to the drying unit after the substrate is transferred to the predetermined position of the drying unit, and stop the supply of the vapor or mist of the purified water to the drying unit thereafter.

In the apparatus of the ninth aspect, when stopping the supply of the vapor or mist of the purified water to the drying unit, the controller may gradually reduce a supply amount.

In the apparatus of the eighth or ninth aspect, the apparatus may further comprise a shutter adapted to isolate the liquid processing unit and the drying unit from each other, wherein the controller may control the shutter such that the shutter isolates the liquid processing unit and the drying unit from each other when the substrate immersed in the purified water stored in the liquid processing unit is transferred to the predetermined position of the drying unit, and the supply of the vapor or mist of the volatile organic solvent to the drying unit is started thereafter. The apparatus may further comprise a gas supply mechanism which supplies a heated inert gas to the drying unit, wherein the controller stops the supply of the vapor or mist of the volatile organic solvent to the drying unit a predetermined time after the start of the supply, and may control the gas supply mechanism to supply the heated inert gas to the drying unit thereafter.

According to a tenth aspect of the present invention, there is provided a substrate processing method comprising: cleaning a substrate by immersing the substrate in purified water stored in a liquid processing unit; transferring the substrate from the liquid processing unit to a drying unit arranged to communicate with the liquid processing unit; substantially uniformizing a liquid film sticking to a surface of the substrate being transferred from the liquid processing unit to the drying unit; and drying the substrate substantially simultaneously within a range of the surface.

In the method of the tenth aspect, substantially uniformizing the liquid film sticking to the surface of the substrate may comprise adhering vapor or mist of purified water to the substrate surface when the substrate is transferred to the drying unit. Drying the substrate substantially simultaneously over the surface may comprise supplying vapor or mist of a volatile organic solvent substantially simultaneously to the substrate surface on which the liquid film of the purified water is formed. The method may further comprise supplying a heated inert gas to the drying unit, after drying the substrate by adhering the vapor or mist of the volatile organic solvent. The volatile organic solvent may comprise isopropyl alcohol (IPA).

According to an eleventh aspect of the present invention, there is provided a substrate processing method comprising: cleaning a substrate by immersing the substrate in purified water stored in a liquid processing unit; starting supply of vapor or mist of purified water to a drying unit arranged to communicate with the liquid processing unit, while the substrate is immersed in the liquid processing unit; transferring the substrate from the liquid processing unit to the drying unit; stopping the supply of the vapor or mist of the purified water to the drying unit after the substrate is transferred to a predetermined position of the drying unit, and starting supply of vapor or mist of a volatile organic solvent to the drying unit thereafter; and stopping the supply of the vapor or mist of the volatile organic solvent to the drying unit after an elapse of a predetermined time.

According to a twelfth aspect of the present invention, there is provided a substrate processing method comprising: cleaning a substrate by immersing the substrate in purified water stored in a liquid processing unit; starting transfer of the substrate from the liquid processing unit to a drying unit arranged to communicate with the liquid processing unit, and starting supply of vapor or mist of purified water to the drying unit thereafter; stopping the supply of the vapor or mist of the purified water to the drying unit after the substrate is transferred to a predetermined position of the drying unit, and starting supply of vapor or mist of a volatile organic solvent to the drying unit thereafter; and stopping the supply of the vapor or mist of the volatile organic solvent to the drying unit after an elapse of a predetermined time.

According to a thirteenth aspect of the present invention, there is provided a substrate processing method comprising: cleaning a substrate by immersing the substrate in purified water stored in a liquid processing unit; starting supply of vapor or mist of purified water to a drying unit arranged to communicate with the liquid processing unit, while the substrate is immersed in the liquid processing unit; transferring the substrate from the liquid processing unit to the drying unit; starting supply of vapor or mist of a volatile organic solvent to the drying unit after the substrate is transferred to a predetermined position of the drying unit, and stopping the supply of the vapor or mist of the purified water to the drying unit thereafter; and stopping the supply of the vapor or mist of the volatile organic solvent to the drying unit after an elapse of a predetermined time.

In the method of the thirteenth aspect, the stopping of the supply of the vapor or mist of the purified water to the drying unit may comprise gradually reducing a supply amount when stopping the supply of the vapor or mist of the purified water.

According to a fourteenth aspect of the present invention, there is provided a substrate processing method comprising: cleaning a substrate by immersing the substrate in purified water stored in a liquid processing unit; starting transfer of the substrate from the liquid processing unit to a drying unit arranged to communicate with the liquid processing unit, and starting supply of vapor or mist of purified water to the drying unit thereafter; starting supply of vapor or mist of a volatile organic solvent to the drying unit after the substrate is transferred to a predetermined position of the drying unit, and stopping the supply of the vapor or mist of the purified water to the drying unit thereafter; and stopping the supply of the vapor or mist of the volatile organic solvent to the drying unit.

In either of the thirteenth and fourteenth aspects, stopping the supply of the vapor or mist of the purified water to the drying unit may comprise gradually reducing a supply amount when stopping the supply of the vapor or mist of the purified water.

In any one of the eleventh to fourteenth aspects, the method may further comprise supplying a heated drying gas to the drying unit and drying the substrate by evaporating the volatile organic solvent on a surface of the substrate, after stopping the supply of the vapor or mist of the volatile organic solvent. The liquid processing unit and the drying unit may be isolated from each other when the substrate is transferred to the predetermined position of the drying unit. The volatile organic solvent may comprise isopropyl alcohol (IPA).

According to a fifteenth aspect of the present invention, there is provided a computer readable storage medium storing a control program operating on a computer, the control program causing, when executed, the computer to control a substrate processing apparatus to execute a substrate processing method comprising cleaning a substrate by immersing the substrate in purified water stored in a liquid processing unit, transferring the substrate from the liquid processing unit to a drying unit arranged to communicate with the liquid processing unit, substantially uniformizing a liquid film sticking to a surface of the substrate being transferred from the liquid processing unit to the drying unit, and drying the substrate substantially simultaneously within a range of the surface.

According to a sixteenth aspect of the present invention, there is provided a computer readable storage medium storing a control program operating on a computer, the control program causing, when executed, the computer to control a substrate processing apparatus to execute a substrate processing method comprising cleaning a substrate by immersing the substrate in purified water stored in a liquid processing unit, starting supply of vapor or mist of purified water to a drying unit arranged to communicate with the liquid processing unit, while the substrate is immersed in the liquid processing unit, transferring the substrate from the liquid processing unit to the drying unit, stopping the supply of the vapor or mist of the purified water to the drying unit after the substrate is transferred to a predetermined position of the drying unit, and starting supply of vapor or mist of a volatile organic solvent to the drying unit thereafter, and stopping the supply of the vapor or mist of the volatile organic solvent to the drying unit after an elapse of a predetermined time.

According to a seventeenth aspect of the present invention, there is provided a computer readable storage medium storing a control program operating on a computer, the control program causing, when executed, the computer to control a substrate processing apparatus to execute a substrate processing method comprising a step of cleaning a substrate by immersing the substrate in purified water stored in a liquid processing unit, starting transfer of the substrate from the liquid processing unit to a drying unit arranged to communicate with the liquid processing unit, and starting supply of vapor or mist of purified water to the drying unit thereafter, stopping the supply of the vapor or mist of the purified water to the drying unit after the substrate is transferred to a predetermined position of the drying unit, and starting supply of vapor or mist of a volatile organic solvent to the drying unit thereafter, and stopping the supply of the vapor or mist of the volatile organic solvent to the drying unit after an elapse of a predetermined time.

According to an eighteenth aspect of the present invention, there is provided a computer readable storage medium storing a control program operating on a computer, the control program causing, when executed, the computer to control a substrate processing apparatus to execute a substrate processing method comprising cleaning a substrate by immersing the substrate in purified water stored in a liquid processing unit, starting supply of vapor or mist of purified water to a drying unit arranged to communicate with the liquid processing unit, while the substrate is immersed in the liquid processing unit, transferring the substrate from the liquid processing unit to the drying unit, starting supply of vapor or mist of a volatile organic solvent to the drying unit after the substrate is transferred to a predetermined position of the drying unit, and stopping the supply of the vapor or mist of the purified water to the drying unit thereafter, and stopping the supply of the vapor or mist of the volatile organic solvent to the drying unit after an elapse of a predetermined time.

According to a nineteenth aspect of the present invention, there is provided a computer readable storage medium storing a control program operating on a computer, the control program causing, when executed, the computer to control a substrate processing apparatus to execute a substrate processing method comprising cleaning a substrate by immersing the substrate in purified water stored in a liquid processing unit, starting transfer of the substrate from the liquid processing unit to a drying unit arranged to communicate with the liquid processing unit, and starting supply of vapor or mist of purified water to the drying unit thereafter, starting supply of vapor or mist of a volatile organic solvent to the drying unit when the substrate is transferred to a predetermined position of the drying unit, and stopping the supply of the vapor or mist of the purified water to the drying unit thereafter, and stopping the supply of the vapor or mist of the volatile organic solvent to the drying unit.

The present invention can suppress the occurrence of pattern fall, after a substrate is processed with purified water, by supplying a fluid mixture containing purified water and a volatile solvent to the substrate, preferably, by changing the concentration of the volatile solvent, or by supplying a fluid mixture containing vapor or mist of purified water and vapor or mist of a volatile organic solvent to the drying unit, and controlling the supply of the fluid mixture. As a consequence, a good circuit pattern can be obtained. It is also possible to suppress the formation of a watermark because the substrate is finally dried by volatilizing the volatile organic solvent on the substrate surface.

Also, the present invention can suppress the occurrence of pattern fall and the formation of a watermark at the same time, because when drying a substrate by transferring it to a drying unit communicating with a liquid processing unit after processing the substrate by immersing it in purified water in the liquid processing unit, the liquid film sticking to the surface of the substrate is substantially uniformized over the surface, and the substrate is substantially simultaneously dried over the surface when the surface of the substrate is dried. This makes it possible to obtain a high-quality substrate having a good circuit pattern, and helps increase the production yield of the product.

BEST MODE FOR CARRYING OUT THE INVENTION

Embodiments of the present invention will be explained in detail below with reference to the accompanying drawings.

Figure 1:
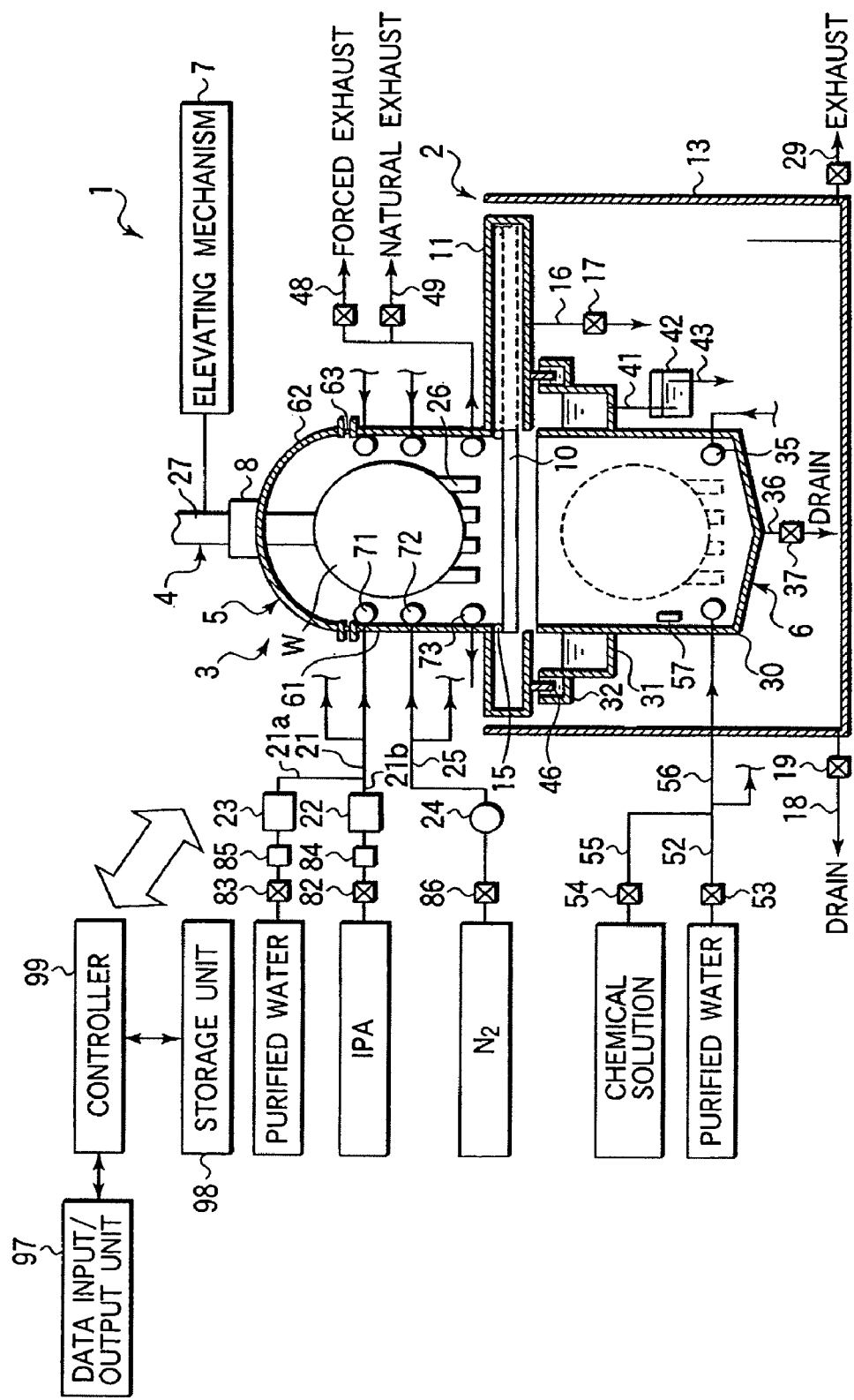
FIG. 1 This is a schematic view showing an outline of the structure of a substrate processing apparatus according to an embodiment of the present invention.

FIG. 1 is a schematic view showing an outline of the structure of a substrate processing apparatus according to an embodiment of the present invention. This embodiment will be explained by taking, as an example, an apparatus that simultaneously processes, by using a predetermined chemical solution, a plurality of semiconductor wafers (to be referred to as "wafers" hereinafter) having a predetermined circuit pattern formed by, e.g., photolithography, rinses the processed wafers with purified water (DIW), and dries the rinsed wafers.

A substrate processing apparatus 1 comprises a liquid processing unit 2, drying unit 3, and wafer guide 4. The liquid processing unit 2 processes a wafer W by using a predetermined chemical solution such as an aqueous dilute hydrofluoric acid solution (DHF), an ammonia-hydrogen peroxide solution (APF), or a sulfuric acid-hydrogen peroxide solution (SPM), and rinses the wafer W with purified water (DIW) after that. The drying unit 3 is arranged above the liquid processing unit 2, and dries the wafer W rinsed by the liquid processing unit 2. The wafer guide 4 is capable of holding a plurality of wafers W, and (vertically) movable between the liquid processing unit 2 and drying unit 3 by an elevating mechanism 7. A fan filter unit (FFU) (not shown) is arranged above the substrate processing apparatus 1, and supplies clean air as a down flow to the substrate processing apparatus 1.

The wafer guide 4 has a holding unit 26 capable of vertically holding a maximum of 50 wafers W at predetermined intervals in the direction (horizontal direction) perpendicular to the drawing surface of FIG. 1, and a support 27 for supporting the holding unit 26. The support 27 extends through a lid 62 of a chamber 5 (to be described later).

The liquid processing unit 2 has a box 13, and a liquid processing bath 6 accommodated in the box 13. The liquid processing bath 6 has an inner bath 30, middle bath 31, and outer bath 32. The inner bath 30 appropriately alternately stores a chemical solution and purified water, and performs chemical solution processing or a rinsing process by immersing the wafers W in the chemical solution or purified water. The middle bath 31 is formed to surround the upper opening of the inner bath 30. The outer bath 32 is formed to surround the opening of the middle bath 31.

The inner bath 30 incorporates a process liquid delivery nozzle 35 for delivering the chemical solution and purified water into the inner bath 30, and a concentration sensor 57 for measuring the concentration of the chemical solution. A process liquid supply line 56 attached to the process liquid delivery nozzle 35 branches into a purified water supply line 52 and chemical solution supply line 55. A purified water supply source supplies purified water to the process liquid delivery nozzle 35 through the purified water supply line 52 via a switching valve 53, and through the process liquid supply line 56. A chemical solution supply source supplies a chemical solution to the process liquid delivery nozzle 35 through the chemical solution supply line 55 via a switching valve 54, and through the process liquid supply line 56.

A drain pipe 36 is connected to the bottom of the inner bath 30 via a switching valve 37. The chemical solution or purified water stored in the inner bath 30 can be drained into the box 13 by opening the switching valve 37. Also, a drain pipe 18 is connected to the lower portion of the box 13 via a switching valve 19, so the chemical solution or purified water can be drained from the box 13. Furthermore, an exhaust pipe 29 for exhausting an atmosphere gas from the box 13 is connected to it, so the vapor of the chemical solution and the like can be exhausted.

The middle bath 31 receives the chemical solution or purified water overflowing from the upper opening of the inner bath 30. A drain pipe 41 for draining the chemical solution or purified water from the middle bath 31 is connected to it, and a trap 42 is connected to the drain pipe 41. In the trap 42, the lower end (drain port) of the drain pipe 41 is positioned to be lower than the upper end (discharge port) of a drain pipe 43 such that the chemical solution or purified water drained through the drain pipe 41 is stored at a predetermined height and drained from the trap 42 through the drain pipe 43 that opens in the surface of the chemical solution or purified water. This arrangement makes it possible to prevent the atmosphere in the drain pip 43 or box 13 from flowing into the drain pipe 41.

Pure water is always stored in the outer bath 32. An annular sealing plate 46 is formed such that its lower portion is immersed in the purified water and its upper end is in tight contact with the lower plate of a shutter box 11 placed above the outer bath 32. In this arrangement, the outer bath 32 has a sealing function using the purified water, and prevents the atmosphere in the inner bath 30 from leaking outside.

The drying unit 3 has the chamber 5 for accommodating the wafers W. The chamber 5 comprises a cylindrical portion 61, and the dome-like lid 62 that opens and closes the upper opening of the cylindrical portion 61. The lower opening of the cylindrical portion 61 is airtightly connected to an opening formed in the upper plate of the shutter box 11.

The lid 62 can vertically move by an elevating mechanism (not shown). As shown in FIG. 1, the chamber 5 is closed when the lower end face of the lid 62 abuts against an air seal ring 63 formed on the upper end of the cylindrical portion 61. Also, with the lid 62 being moved upward from the position shown in FIG. 1 (i.e., with the chamber 5 being open), the wafers W can be loaded and unloaded between the outside of the substrate processing apparatus 1 and the inside of the drying unit 3. More specifically, with the holding unit 26 of the wafer guide 4 protruding from the cylindrical portion 61, the wafers W are transferred between the holding unit 26 and an external transfer apparatus or the like (not shown).

A fluid nozzle 71 for supplying one or a mixture of water vapor and vapor of isopropyl alcohol (IPA) into the chamber 5 is disposed in the chamber 5. A pipe 21 is connected to the fluid nozzle 7. The pipe 21 branches into pipes 21a and 21b respectively connected to a purified water supply source and IPA supply source. Pure water is supplied to a water vapor generator (heating device) 23 at a predetermined flow rate by opening a switching valve 83 formed in the pipe 21a and operating a flow control valve 85, thereby generating water vapor. Similarly, IPA is supplied to an IPA vapor generator 22 at a predetermined flow rate by opening a switching valve 82 formed in the pipe 21b and operating a flow control valve 84, thereby generating IPA vapor. These water vapor and IPA vapor are sprayed from the fluid nozzle 71 into the chamber 5 singly or after being mixed in the fluid supply line 21. In this case, the IPA concentration in the fluid mixture supplied from the fluid nozzle 71 can be changed by controlling the flow control valves 84 and 85 by a controller 99 (to be described later).

The fluid nozzle 71 preferably has a structure which has a cylindrical shape and in which vapor spray holes are formed at predetermined intervals in the longitudinal direction (the direction perpendicular to the drawing surface of FIG. 1). The fluid nozzle 71 is disposed such that the vapor spray holes spray water vapor or IPA vapor not directly against the wafers W accommodated in the chamber 5 but obliquely upward. The streams of water vapor or IPA vapor sprayed from the fluid nozzle 71 pass through the right and left portions above the wafers W, and rise toward the upper portion of the inner surface of the lid 62. After that, these vapor streams mix with each other in the center of the upper portion of the lid 62, and the vapor falls down, flows between the wafers W, and flows down along the surfaces of the wafers W.

When drying the wafers W by spraying IPA vapor against them from the fluid nozzle 71 as described above in accordance with a second wafer cleaning method (to be described later), the IPA arrival time difference between the upper and lower ends of the wafers W is a few fractions of a second or less, so IPA can be substantially simultaneously supplied to the surface of the wafer W. Accordingly, the surfaces of the wafers W can be substantially simultaneously dried as will be described later. Note that when drying the wafers W by the IPA vapor, the flow rate of the IPA vapor need only be increased in order to further decrease the drying time difference on the surface. For example, in a drying chamber having a volume of 50 L and capable of processing 50 wafers, the flow rate is desirably 2.0 mL/sec/batch or more, and preferably, 3.5 mL/sec/batch or more.

Also, a nitrogen gas nozzle 72 for spraying nitrogen ($N_2$) gas at room temperature or heated to a predetermined temperature is disposed in the chamber 5. Nitrogen gas at room temperature is supplied from a nitrogen gas supply source to a heater 24 by operating a switching valve 86. If the heater 24 has not been heated, the room-temperature nitrogen gas is sprayed from the nitrogen gas nozzle 72 through a nitrogen gas supply line 25. On the other hand, nitrogen gas heated to a predetermined temperature by heating the heater 24 to a predetermined temperature can be sprayed from the nitrogen gas nozzle 72 through the nitrogen gas supply line 25.

The nitrogen gas nozzle 72 preferably has the same structure as the fluid nozzle 71. The nitrogen gas nozzle 72 is favorably disposed such that nitrogen gas is sprayed from its gas spray holes not directly against the wafers W accommodated in the chamber 5 but obliquely upward. The streams of nitrogen gas sprayed from the nitrogen gas nozzle 72 pass through the right and left portions above the wafers W, and rise toward the upper portion of the inner surface of the lid 62. These gas streams mix with each other in the center of the upper portion of the lid 62, and the gas falls down, flows between the wafers W, and flows down along the surfaces of the wafers W.

Furthermore, an exhaust nozzle 73 for exhausting the atmosphere gas from the chamber 5 is disposed in it. The exhaust nozzle 73 is connected to a natural exhaust line 49 for performing natural exhaust from the chamber 5, and a forced exhaust line 48 for performing forced exhaust. The exhaust nozzle 73 preferably has a structure which has a cylindrical shape, and in which slit-type air inlet holes having a predetermined length for taking in a gas from the chamber 5 are formed at predetermined intervals in the longitudinal direction (the direction perpendicular to the drawing surface of FIG. 1).

Figure 2:
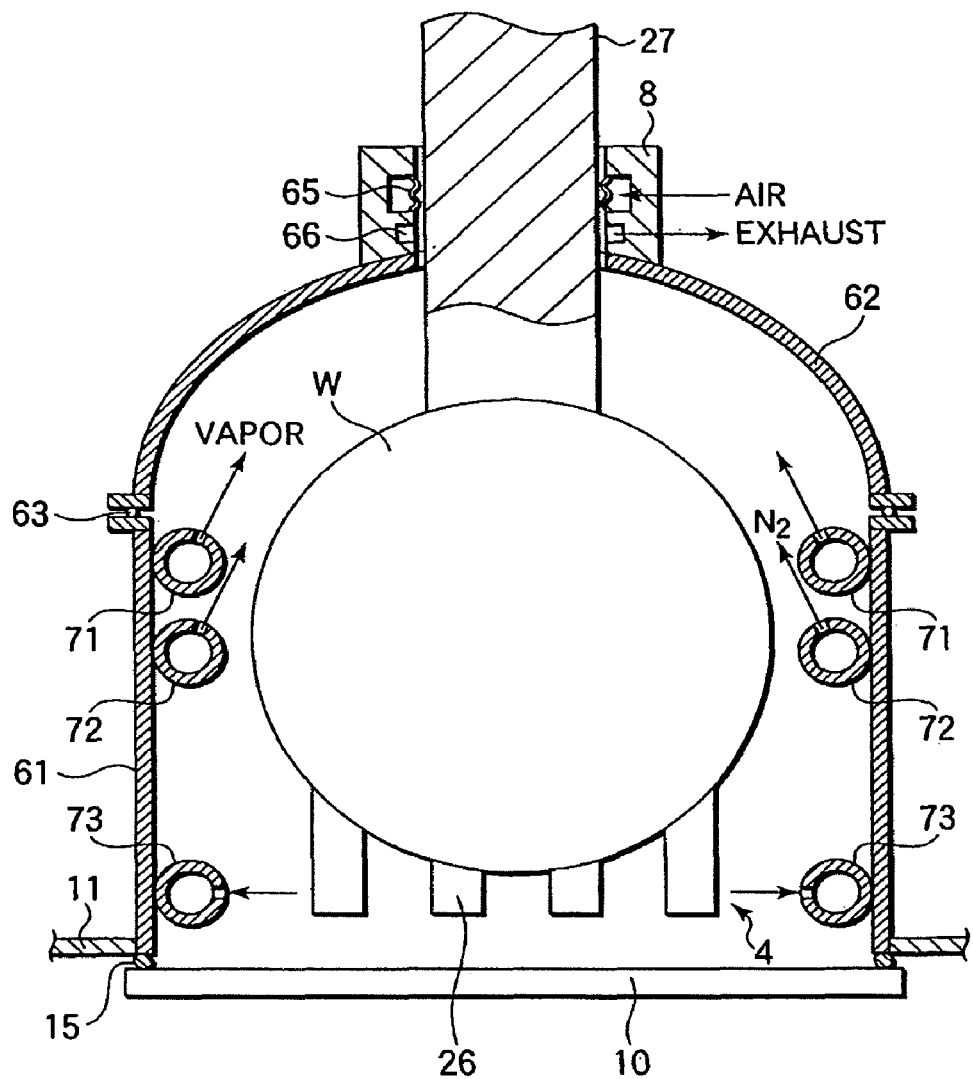
FIG. 2 This is a schematic sectional view showing a local exhaust device of the substrate processing apparatus shown in FIG. 1.

A local exhaust device 8 is attached to the top on the outside of the lid 62. FIG. 2 is a schematic sectional view of the local exhaust device 8. The local exhaust device 8 has an air seal ring 65 and annular exhaust pipe 66. When air (or nitrogen gas or the like) is supplied, the air seal ring 65 deforms, expands, and comes in tight contact with the outer surface of the wafer guide 4, thereby sealing the spacing between the support 27 of the wafer guide 4 and the lid 62. The exhaust pipe 66 exhausts a gas entering the spacing between the support 27 of the wafer guide 4 and the lid 62. Note that FIG. 2 shows the state in which sealing by the air seal ring 65 is not performed.

As shown in FIG. 2, in the state in which no air is supplied to (or air is exhausted from) the air seal ring 65, the air seal ring 65 is separated from the wafer guide 4, so the wafer guide 4 can be vertically moved. By thus exhausting air from the exhaust pipe 66 when vertically moving the wafer guide 4, it is possible to prevent the atmosphere gas in the chamber 5 from leaking outside. Note that deterioration of the air seal ring 65 by the IPA vapor can be suppressed by placing the exhaust pipe 66 below the air seal ring 65.

The atmosphere in the liquid processing bath 6 formed in the liquid processing unit 2 and the atmosphere in the chamber 5 formed in the drying unit 3 can be isolated from each other or can communicate with each other by a shutter 10 horizontally slidably placed in the middle of the liquid processing bath 6 and chamber 5. When performing liquid processing in the liquid processing bath 6 and moving the wafers W between the liquid processing bath 6 and chamber 5, the shutter 10 is housed in the shutter box 11. When the shutter 10 is positioned immediately below the cylindrical portion 61, a seal ring 15 formed on the upper surface of the shutter 10 abuts against the lower end of the cylindrical portion 61, thereby airtightly closing the lower opening. Note that an exhaust pipe 16 is connected to the shutter box 11 via a switching valve 17, so the atmosphere in the shutter box 11 can be exhausted.

The controller (process controller) 99 controls, e.g., the driving of various mechanisms (e.g., the vertical movements of the lid 62 and wafer guide 4, and sliding of the shutter 10), and the valves for controlling the supply of fluids such as nitrogen gas, purified water, and IPA from their respective supply sources to the substrate processing apparatus 1, when the wafers W are processed in the substrate processing apparatus 1. The controller 99 is connected to a keyboard with which the process manager inputs commands and the like to manage the substrate processing apparatus 1, and a data input/output unit 97 such as a display that visually displays the operation status of the substrate processing apparatus 1.

The controller 99 is also connected to a storage unit 98 storing a control program for implementing various processes executed by the substrate processing apparatus 1 under the control of the controller 99, and programs (i.e., recipes) for allowing the individual components of the substrate processing apparatus 1 to execute processes in accordance with the process conditions. The recipes can be stored in a hard disk, semiconductor memory, or the like, and can also be set in a predetermined position of the storage unit 98 as they are stored in a computer readable portable storage medium such as a CD-ROM or DVD-ROM. It is also possible to appropriately transmit the recipes from another apparatus through, e.g., a dedicated line.

In accordance with, e.g., an instruction from the data input/output unit 97, the controller 99 reads out a given necessary recipe from the storage unit 98 and executes the readout recipe. In this manner, the substrate processing apparatus 1 performs desired processing under the control of the controller 99.

A wafer W cleaning method using the substrate processing apparatus described above will be explained below.

<First Cleaning Method>

In a first cleaning method, wafers are cleaned with purified water in the liquid processing unit 2, and then dried by supplying a fluid mixture containing vapor of purified water and vapor of IPA as a volatile organic solvent to the drying unit 3.

Figure 3:
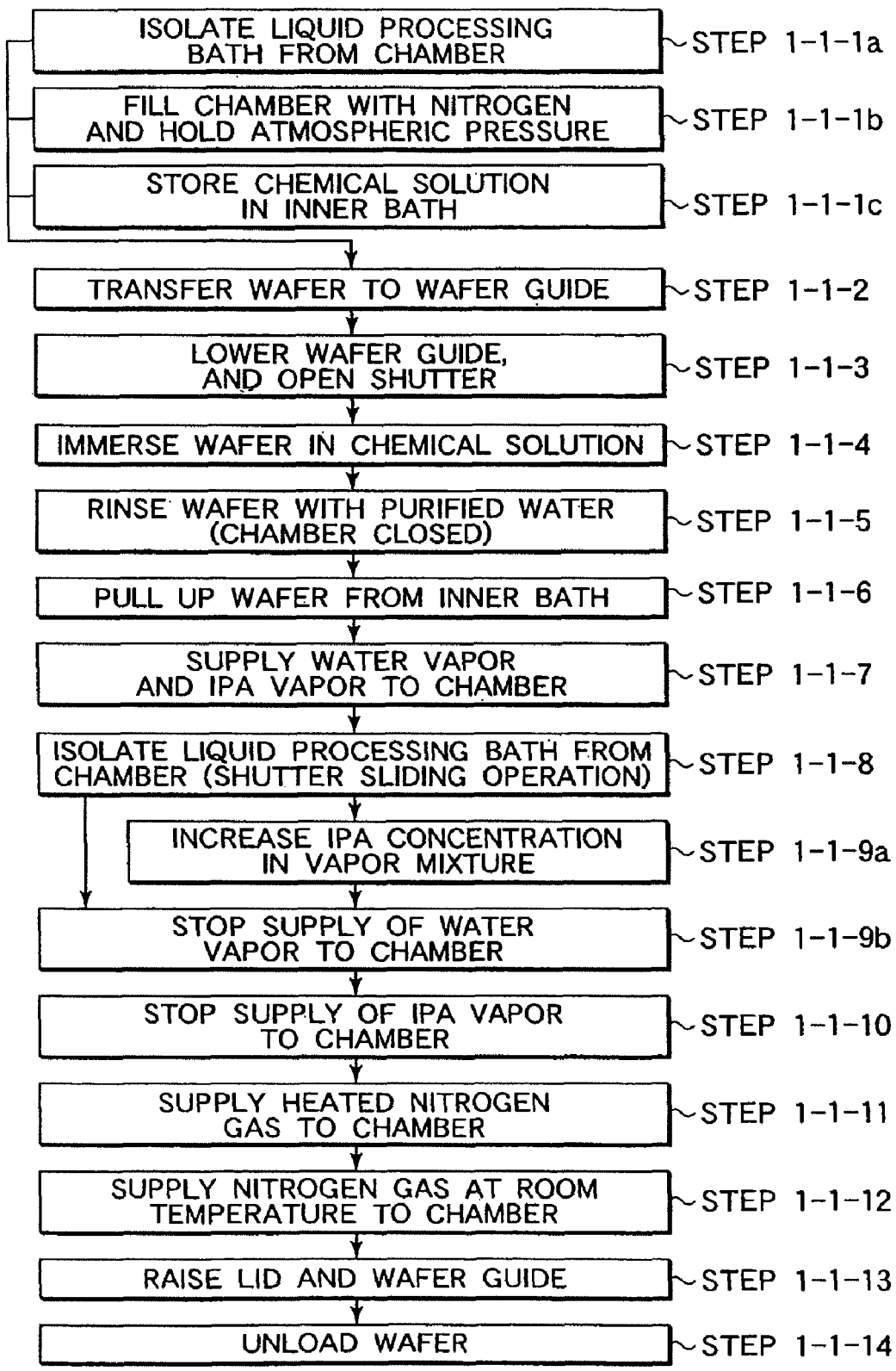
FIG. 3 This is a flowchart showing a first example of a first cleaning method performed by the substrate processing apparatus shown in FIG. 1.

First, a first example will be explained. FIG. 3 is a flowchart showing the first example of the first cleaning method.

Initially, the shutter 10 isolates the liquid processing bath 6 and chamber 5 from each other (STEP 1-1-1a). The chamber 5 is filled with nitrogen gas, and the internal pressure is made equal to the atmospheric pressure (STEP 1-1-1b). A predetermined chemical solution is stored in the inner bath 30 of the liquid processing bath 6 (STEP 1-1-1c). In this state, the holding unit 26 of the wafer guide 4 is positioned in the drying unit 3.

The lid 62 is raised, the holding unit 26 of the wafer guide 4 is protruded upward from the cylindrical portion 61, the supply of nitrogen gas into the chamber 5 is stopped, and 50 wafers W are transferred from an external substrate transfer apparatus (not shown) to the holding unit 26 of the wafer guide 4 (STEP 1-1-2). Then, the wafers W are accommodated in the cylindrical portion 61 of the chamber 5 by lowering the wafer guide 4, and the lid 62 is lowered. In this state, the upper surface of the cylindrical portion 61 is slightly open. After that, while forced exhaust is performed from the exhaust nozzle 73, the shutter 10 is slid so that the liquid processing bath 6 and chamber 5 communicate with each other (STEP 1-1-3).

Even when the shutter 10 is open as described above, a down flow from the fan filter unit (FFU) (not shown) flows into the chamber 5 and forms a clean air flow from the upper opening of the cylindrical portion 61 to the exhaust nozzle 73. This makes it possible to prevent the atmosphere of the chemical solution stored in the inner bath 30 from rising to the chamber 5.

Subsequently, the held wafers W are immersed in the chemical solution stored in the inner bath 30 for a predetermined time by further lowering the wafer guide 4 (STEP 1-1-4). When the wafers W are completely processed by the chemical solution, the chemical solution in the inner bath 30 is replaced with purified water, while the wafers W are immersed in the inner bath 30, by supplying the purified water into the inner bath 30 from the process liquid delivery nozzle 35, thereby rinsing the wafers W (STEP 1-1-5). In this step, the chemical solution and purified water overflowing from the inner bath 30 are received by the middle bath 31, and drained through the drain pipe 41 and trap 42. Note that the replacement of the chemical solution with the purified water in the inner bath 30 may also be performed by draining the chemical solution to the box 13 through the drain pipe 36, and supplying the purified water to the inner bath 30 after that.

Whether the chemical solution in the inner bath 30 is replaced with the purified water can be determined by the measurement value of the concentration sensor 57. If it is confirmed by the measurement value of the concentration sensor 57 that the chemical solution in the inner bath 30 is replaced with the purified water and drained from the inner bath 30, the forced exhaust line 48 is switched to the natural exhaust line 49, and the upper surface of the cylindrical portion 61 is closed by lowering the lid 62. In this case, exhaust from the exhaust pipe 66 is started without performing sealing by the air seal ring 65 in the local exhaust device 8. This makes it possible to prevent the atmosphere gas in the chamber 5 from leaking outside. In addition, it is favorable to hold a nitrogen gas atmosphere in the chamber 5 by supplying nitrogen gas heated to a predetermined temperature from the nitrogen gas nozzle 72 to the chamber 5. Since this warms the chamber 5, condensation of water vapor and IPA vapor on the inner walls of the chamber 5 can be suppressed when the water vapor and IPA vapor are supplied into the chamber 5 later.

When a predetermined time of rinsing of the wafers W by the purified water has elapsed, the supply of the heated nitrogen gas is stopped, if the heated nitrogen gas has been supplied into the chamber 5, and pulling up of the wafer guide 4 is started in order to accommodate the wafers W in the chamber 5 (STEP 1-1-6). When the lower ends of the wafers W emerge from the surface of the purified water stored in the inner bath 30 (i.e., when the wafers W completely emerge from the surface of the purified water), a vapor mixture (fluid) containing water vapor and IPA vapor is immediately supplied into the chamber 5 from the fluid nozzle 71 (STEP 1-1-7). Consequently, the purified water film formed on the surface of the wafer W pulled up from the purified water is entirely replaced with a film of the liquid mixture containing purified water and IPA. This protects the circuit pattern formed on the wafer W from being dried. It is also possible to make the thickness of the liquid film uniform. Accordingly, no pattern fall occurs in STEP 1-1-7.

When the wafers W have risen to the position where they are accommodated in the chamber 5, the upward movement of the wafer guide 4 is stopped, the atmospheres in the liquid processing bath 6 and chamber 5 are isolated from each other by closing the shutter 10 (STEP 1-1-8), and the seal ring 65 formed in the local exhaust device 8 seals the spacing between the support 27 of the wafer guide 4 and the lid 62. After that, the exhaust from the exhaust pipe 66 may also be stopped. When the wafers W are held in a predetermined position in the chamber 5, the supply amount of the water vapor supplied into the chamber 5 is continuously or gradually reduced, i.e., the IPA concentration in the vapor mixture is continuously or gradually increased (STEP 1-1-9*a*), and the supply of the water vapor is stopped after that (STEP 1-1-9*b*). Alternatively, the supply of the water vapor is stopped in STEP 1-1-9*b* without performing STEP 1-1-9*a*.

After that, the liquid mixture films of purified water and IPA formed on the surfaces of the wafers W can be changed into IPA films by continuously supplying the IPA vapor into the chamber 5 for a predetermined time. When the IPA films are thus formed on the surfaces of the wafers W, the supply of the IPA vapor is stopped (STEP 1-1-10), and subsequently a drying process of the wafers W is performed. This drying process can be performed by, e.g., volatilizing or evaporating IPA from the surfaces of the wafers W by supplying nitrogen gas heated to a predetermined temperature into the chamber 5 (STEP 1-1-11), and cooling the wafers W to a predetermined temperature by supplying nitrogen gas at room temperature into the chamber 5 after that (STEP 1-1-12).

When the drying of the wafers W is complete as described above, the sealing by the air seal ring 65 formed in the local exhaust device 8 is canceled, the lid 62 is raised, and the wafer guide 4 is raised substantially at the same time, thereby protruding the wafers W upward from the cylindrical portion 61 of the chamber 5 (STEP 1-1-13). In this step, the supply of the nitrogen gas from the nitrogen gas nozzle 72 is stopped, and clean air from the fan filter unit (FFU) is introduced into the chamber 5 through the forced exhaust line 48. Then, the external substrate transfer apparatus (not shown) accesses the wafer guide 4, and unloads the wafers W from the substrate processing apparatus 1 (STEP 1-1-14).

The first example as described above can suppress the occurrence of the marangoni effect. That is, the state in which one of the opposing side surfaces of a certain projection of the circuit pattern formed on the wafer W is in contact with a gas phase and the other is in contact with a liquid phase hardly occurs. Also, an almost even liquid film is kept formed on the circuit pattern during the period from the timing at which the wafer W is pulled up from the purified water stored in the inner bath 30 to the timing at which the IPA film is formed on the wafer W. In addition, IPA can be evenly evaporated from the entire surface of the wafer W, so the force acting on the projection hardly loses its balance due to the surface tension of the liquid phase. This makes it possible to suppress the occurrence of pattern fall. Furthermore, the wafer W is finally dried by volatilizing or evaporating IPA from the surface of the wafer W. This advantageously prevents easy formation of a watermark.

Also, an abrupt surface tension change between patterns can be decreased by thus performing drying by using the mixture of IPA and purified water, particularly, by changing the IPA concentration in the vapor mixture as indicated by STEP 1-1-9*a* described above. As a consequence, pattern fall can be effectively prevented.

Figure 4:
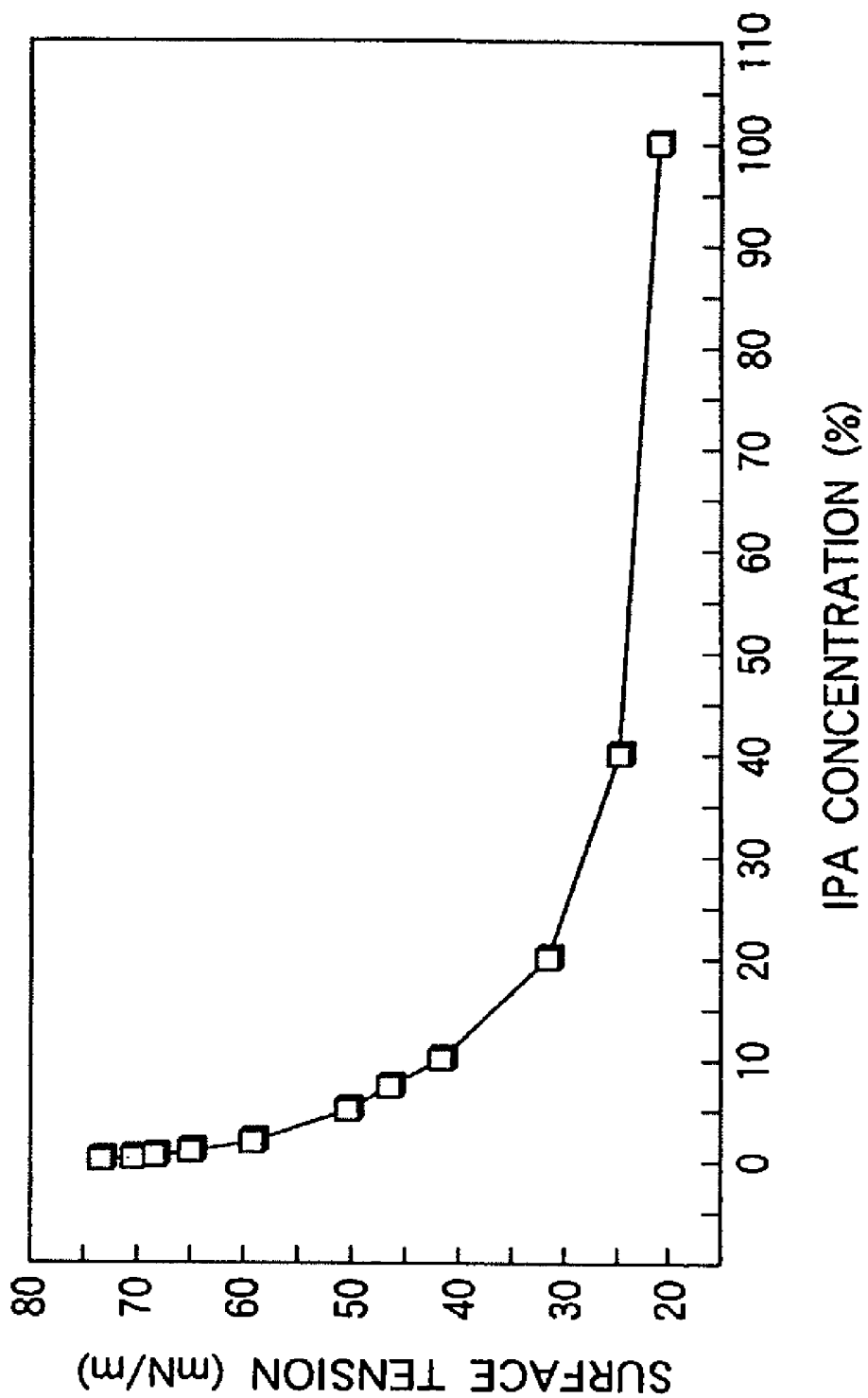
FIG. 4 This is a view showing the relationship between the IPA concentration in a vapor mixture of purified water and IPA to be supplied to a pattern and the surface tension.

This will be explained below with reference to FIG. 4. FIG. 4 is a graph showing the relationship between the IPA concentration in the vapor mixture of purified water and IPA supplied to patterns and the surface tension. When the IPA concentration is 0% on the abscissa, purified water is 100%. As shown in FIG. 4, the surface tension is 70 mN/m or more for 100% purified water, and 20 mN/m for 100% IPA. Therefore, when the amount of IPA is large, eventually, 100%, the surface tension is small, so pattern fall presumably reduces. However, the vapor mixture is not necessarily evenly supplied to all patterns, i.e., uneven supply occurs in practice. In this case, there is the possibility that one pattern has been subjected to replacement with IPA 100%, but another pattern has not been subjected to replacement yet but with 100% purified water remaining thereon. In this case, a 100%-IPA pattern and 100%-purified water pattern have a surface tension difference of 50 mN/m. Also, 100% IPA rapidly dries. This forms a pattern in which water exists due to the uneven supply of IPA, and a pattern in which nothing remains because IP has dried up, thereby producing a large surface tension difference in this case as well. If a large surface tension difference like this is produced, pattern fall occurs in many portions. However, when replacement is performed using the mixture of IPA and water (the vapor mixture of IPA and purified water), drying requires a time longer than that required with 100% IPA. Even if uneven supply occurs, therefore, no abrupt surface tension difference is produced, so pattern fall can be reduced. In particular, the abrupt change in surface tension can be further decreased by changing the IPA concentration, typically, by continuously or gradually raising the IPA concentration. In addition, the drying effect is also high because 100% IPA having high volatility finally remains. As an example of this concentration change, control is performed to gradually change the IPA concentration such that 10% IPA→20% IPA→30% IPA→100% IPA.

Note that when gradually raising the IPA concentration as described above, it is preferable to initially set the IPA concentration at 40% or less and finally set the IPA concentration at 90% or more. This is so because there is no big difference from the case that 100% IPA is used if the concentration is initially higher than 40%, and high drying capability can be achieved when the IPA concentration is finally set at 90% or more.

Note that in the above first example, the IPA concentration is increased by simply reducing the amount of water vapor to be supplied to the chamber 5. However, it is also possible to use a sequence that raises the IPA concentration with the amount of water vapor being held constant, and reduces the amount of water vapor when the IPA concentration has reached a predetermined concentration (e.g., 40%).

Figure 5:
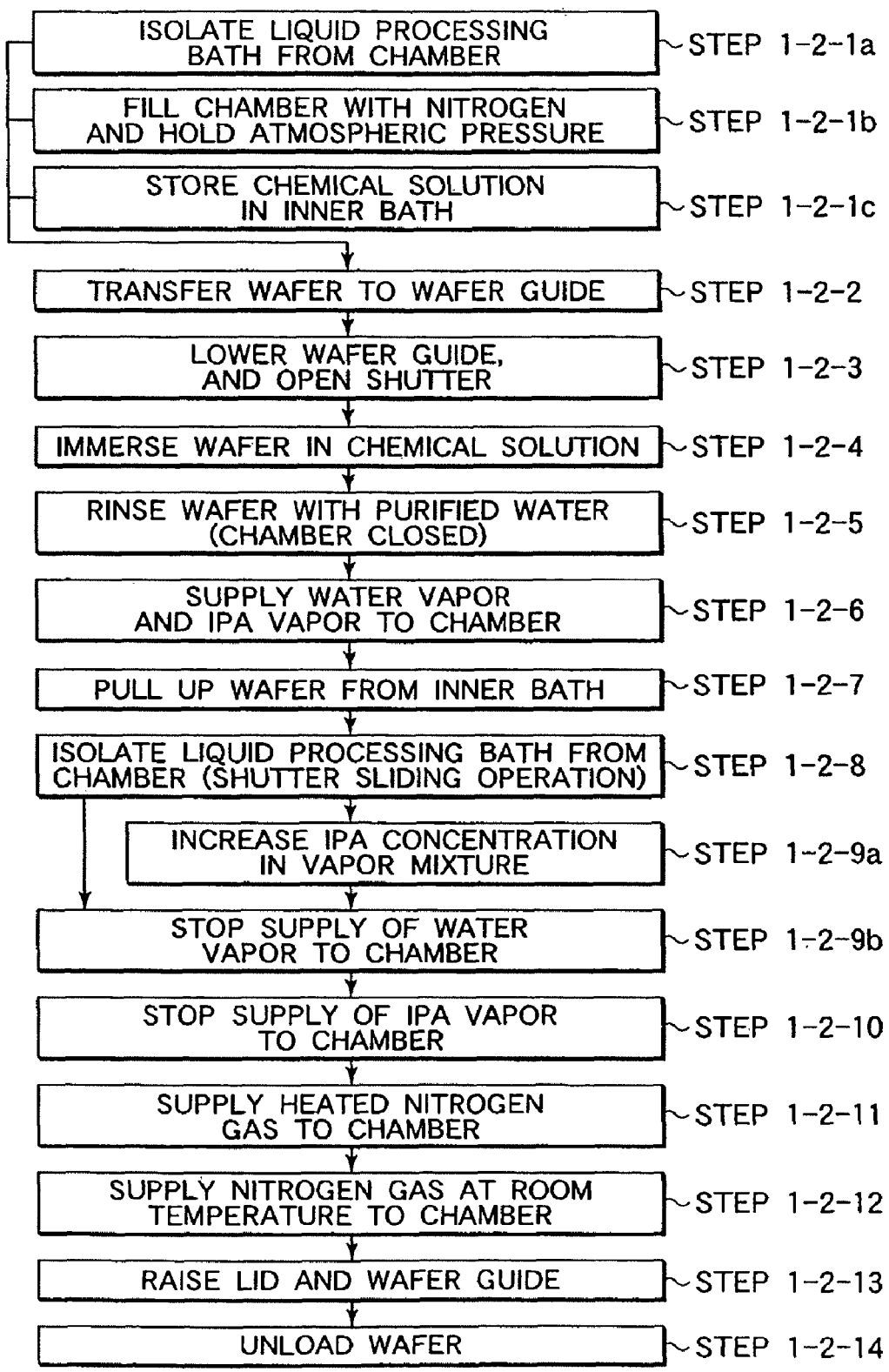
FIG. 5 This is a flowchart showing a second example of the first wafer cleaning method performed by the substrate processing apparatus shown in FIG. 1.

A second example of the first cleaning method will now be explained. FIG. 5 is a flowchart showing the second example of the first cleaning method. Steps from STEP 1-2-1*a* to STEP 1-2-5 of the second example shown in FIG. 5 are the same as the steps from STEP 1-1-1*a* to STEP 1-1-5 of the first example shown in FIG. 3, so a repetitive explanation will be omitted.

In the second example, while the rinsing process of the wafers W is performed in STEP 1-2-5, the supply of water vapor and IPA vapor into the chamber 5 is started at a predetermined timing (STEP 1-2-6). When a predetermined ringing time has elapsed, the wafers W are pulled up from the inner bath 30 toward the chamber 5 at a predetermined rate (STEP 1-2-7). In this state, IPA has dissolved in the surface of purified water stored in the inner bath 30 (i.e., a liquid mixture of purified water and IPA is obtained) in STEP 1-2-6 described above. However, it is possible to suppress the occurrence of the marangoni effect by pulling up the wafers W within a short time. Also, since the atmosphere mixture of the water vapor and IPA vapor is held in the chamber 5 and in the upper space of the liquid processing bath 6, the surfaces of the wafers W hardly dry even when the wafers W are pulled up into these spaces. This also makes it possible to suppress the occurrence of the marangoni effect. Consequently, the occurrence of pattern fall can be suppressed in STEP 1-2-6.

After the wafers W are pulled up to the chamber 5, processes are performed in accordance with steps from STEP 1-2-8 to STEP 1-2-14. However, these steps are the same as the steps from STEP 1-1-8 to STEP 1-1-14 shown in FIG. 3 explained earlier, so an explanation will not be repeated.

In this case, as in the first example, an abrupt surface tension change between patterns can be decreased by performing drying by using a mixture of IPA and purified water, particularly, by changing the IPA concentration in the vapor mixture as explained in STEP 1-1-9*a* described previously. This makes it possible to further effectively prevent pattern fall.

Note that in the second example, as in the above first example, it is also possible to use a sequence that raises the IPA concentration with the amount of water vapor being held constant, and reduces the amount of water vapor when the IPA concentration has reached a predetermined concentration (e.g., 40%).

As described above, the second example of the first cleaning method can also suppress the occurrence of pattern fall and the formation of a watermark as in the first example.

<Second Cleaning Method>

In the second cleaning method, when wafers are transferred to the drying unit 3 after being cleaned with purified water in the liquid processing unit 2, a liquid film sticking to the surface of each wafer being transferred is substantially uniformized, and dried substantially simultaneously over the wafer surface.

Figure 6:
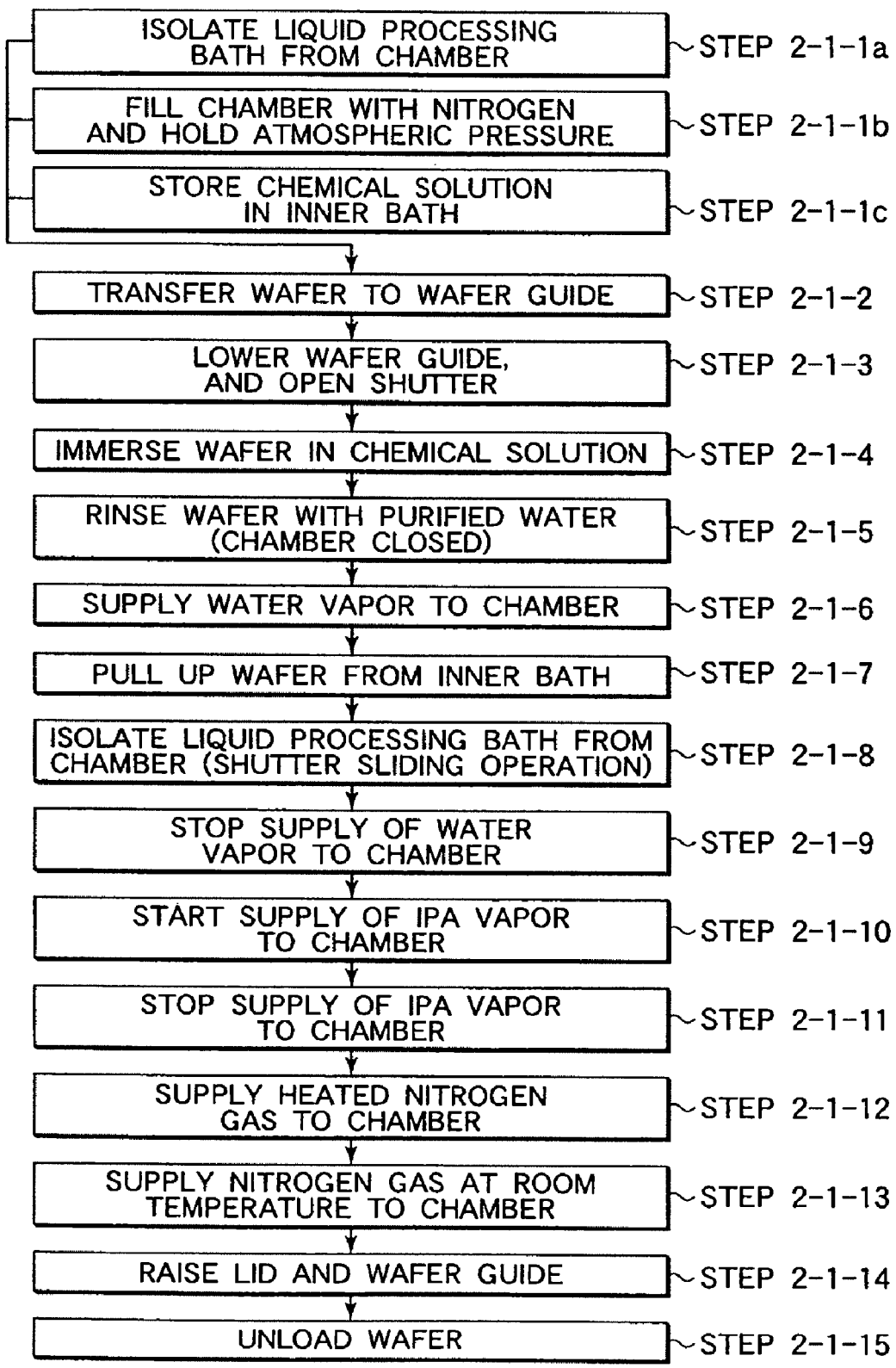
FIG. 6 This is a flowchart showing a first example of a second wafer cleaning method performed by the substrate processing apparatus shown in FIG. 1.

First, a first example will be explained. FIG. 6 is a flowchart showing the first example of the second cleaning method. Steps from STEP 2-1-1*a* to STEP 2-1-5 shown in FIG. 6 are the same as the steps from STEP 1-1-1*a* to STEP 1-1-5 shown in FIG. 3 as the first example of the first cleaning method, so a repetitive explanation will be omitted.

In this example, while the wafers W are rinsed with purified water in STEP 2-1-5, the supply of heated nitrogen gas into the chamber 5 is stopped, if the gas has been supplied, and the supply of water vapor into the chamber 5 is started (STEP 2-1-6). Consequently, the space above the surface of purified water stored in the inner bath 30 is filled with a water vapor atmosphere. After that, pulling up of the wafer guide 4 is started in order to accommodate the wafers W in the chamber 5 (STEP 2-1-7).

In STEP 2-1-7, the wafers W do not dry because they are pulled up into the space filled with water vapor, so no watermark is formed on the wafers W in this stage. Also, when the wafers W are pulled up from the purified water, the water remains in recesses (portions between projections) of a circuit pattern formed on each wafer W. Although the water amount varies, this variation decreases when the water vapor condenses on the surface of the wafer W, and a water film having a uniform thickness is formed. Since this holds the balance of the surface tension of water acting on the projections of the circuit pattern, the occurrence of pattern fall can be suppressed.

When the wafers W are raised to the position where they are accommodated in the chamber 5, the vertical movement of the wafer guide 4 is stopped, the atmospheres in the liquid processing bath 6 and chamber 5 are isolated from each other by closing the shutter 10 (STEP 2-1-8), and the spacing between the support 27 of the wafer guide 4 and the lid 62 is sealed by the seal ring 65 formed in the local exhaust device 8. When the wafers W are held in a predetermined position in the chamber 5, the supply of the water vapor into the chamber 5 is stopped (STEP 2-1-9), and the supply of IPA vapor to the chamber 5 is started (STEP 2-1-10).

In STEP 2-1-9 and STEP 2-1-10, the purified water sticking to the surfaces of the wafers W is replaced with IPA. Since the liquid film formed on each wafer W is entirely evenly replaced with IPA, the change in surface tension of the liquid on the surface of the wafer W is moderate. In addition, as described above, the IPA vapor from the fluid nozzle reaches the wafer surface substantially simultaneously, and dries substantially simultaneously over the wafer surface. Accordingly, the thickness of the liquid film does not vary, and the surface tension acting on the projection of the circuit pattern formed on the wafer W hardly loses its balance. This makes it possible to prevent the occurrence of pattern fall. It is also possible to prevent the formation of a watermark because the IPA vapor dries substantially simultaneously over the wafer surface.

When the liquid films of IPA are formed on the surfaces of the wafers W by supplying the IPA vapor for a predetermined time, the supply of the IPA vapor to the chamber 5 is stopped (STEP 2-1-11), and a drying process of the wafers W is subsequently performed. This drying process can be performed by, e.g., volatilizing or evaporating IPA from the surfaces of the wafers W by supplying nitrogen gas heated to a predetermined temperature into the chamber 5 (STEP 2-1-12), and cooling the wafers W to a predetermined temperature by supplying nitrogen gas at room temperature into the chamber 5 after that (STEP 2-1-13).

Note that the IPA vapor can be dried substantially simultaneously over the wafer surface by supplying the IPA vapor onto the wafer surface substantially simultaneously as described above. If the possibility of the formation of a watermark is low, however, it is also possible to use a method of spraying an inert gas such as $N_2$ against the entire wafer surface.

The surface tension acting on the projection of the circuit pattern formed on the wafer W hardly loses its balance in STEP 2-1-12 and STEP 2-1-13 as well, because IPA on the surface of the wafer W is evenly volatilized. This makes it possible to suppress the occurrence of pattern fall. It is also possible to suppress the formation of a watermark because drying is performed from the state in which IPA alone exists on the surface of the wafer W.

When the wafers W are completely dried, sealing by the air seal ring 65 formed in the local exhaust device 8 is canceled, the lid 62 is raised, and the wafer guide 4 is raised substantially at the same time, thereby protruding the wafers W upward from the cylindrical portion 61 of the chamber 5 (STEP 2-1-14). In this state, the supply of nitrogen gas from the nitrogen gas nozzle 72 is stopped, and clean air is introduced into the chamber 5 from the fan filter unit (FFU) through the forced exhaust line 48. Then, the external substrate transfer apparatus (not shown) accesses the wafer guide 4, and unloads the wafers W from the substrate processing apparatus 1 (STEP 2-1-15).

Figure 7:
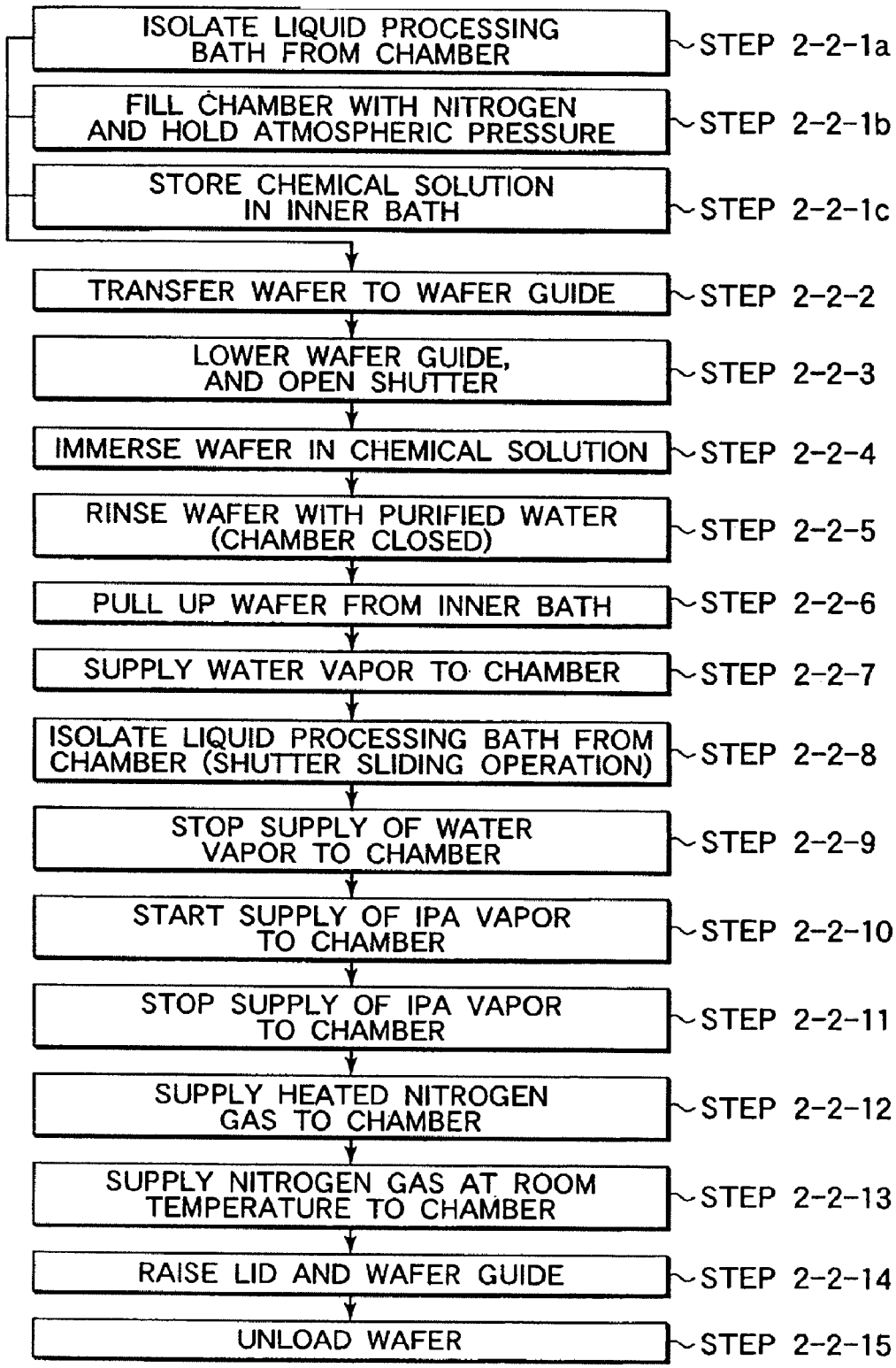
FIG. 7 This is a flowchart showing a second example of the second wafer cleaning method performed by the substrate processing apparatus shown in FIG. 1.

A second example of the second cleaning method will be explained below. FIG. 7 is a flowchart showing the second example of the second cleaning method. In the second example shown in FIG. 7, the order of steps from STEP 2-1-6 to STEP 2-1-8 in the first example shown in FIG. 6 is changed. Accordingly, steps from STEP 2-2-1$a$ to STEP 2-2-5 and from STEP 2-2-9 to STEP 2-2-15 shown in FIG. 7 are the same as the steps from STEP 2-1-1$a$ to STEP 2-1-5 and from STEP 2-1-9 to STEP 2-1-15 of the first example shown in FIG. 6, so an explanation will not be repeated.

In the second example, after the rinsing process in STEP 2-2-5 is complete, pulling up of the wafers W from the inner bath 30 to the chamber 5 is started at a predetermined rate (STEP 2-2-6). During the period from the timing at which pulling up of the wafers W is started to the timing at which the wafers W reach a predetermined position in the chamber 5 and are held in this position, the supply of water vapor into the chamber 5 is started (STEP 2-2-7). The pulling rate of the wafers W and the start timing of the supply of the water vapor are set such that no watermarks are formed on the surfaces of the wafers W pulled up from the inner bath 30 because they dry. It is also possible to supply the water vapor after an elapse of a predetermined time from the arrival of the wafers W at the predetermined position, provided that no watermark is formed.

After the wafers W are raised to the position where they are accommodated in the chamber 5, the shutter 10 isolates the atmospheres in the liquid processing bath 6 and chamber 5 from each other (STEP 2-2-8). As described in FIG. 7, STEP 2-2-8 is performed after STEP 2-2-7. As described previously, however, STEP 2-2-8 may also be performed before STEP 2-2-7. That is, it is also possible to pull up the wafers W, close the shutter 10, and supply water vapor into the chamber 5 after that.

When the wafers W are processed by using the second example, as in the first example, a purified water film having a uniform thickness is formed on the surface of the wafer W pulled up from the inner bath 30, without drying the wafer W, and replaced with a liquid film of IPA after that by supplying IPA vapor onto the wafer surface substantially simultaneously, and then the liquid film is dried substantially simultaneously over the wafer surface by volatilizing IPA. This makes it possible to suppress the formation of a watermark and the occurrence of pattern fall at the same time.

Figure 8:
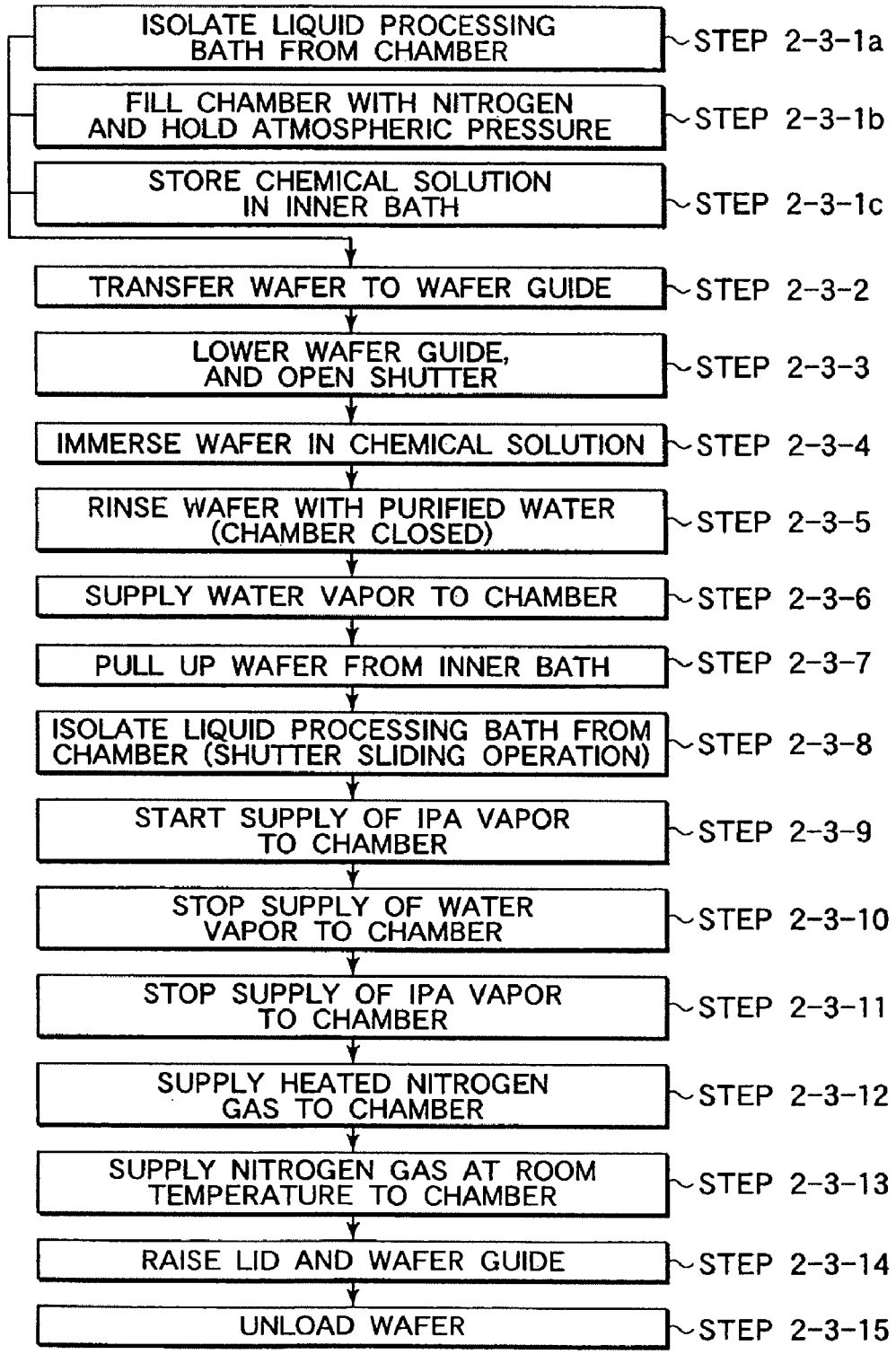
FIG. 8 This is a flowchart showing a third example of the second wafer cleaning method performed by the substrate processing apparatus shown in FIG. 1.

A third example of the second cleaning method will now be explained. FIG. 8 is a flowchart showing the third example of the second cleaning method. In the third example shown in FIG. 8, the order of STEP 2-1-9 and STEP 2-1-10 of the first example shown in FIG. 6 is changed. Accordingly, steps from STEP 2-3-1$a$ to STEP 2-3-8 and from STEP 2-3-11 to STEP 2-3-15 shown in FIG. 8 are the same as the steps from STEP 2-1-1$a$ to STEP 2-1-8 and from STEP 2-1-11 to STEP 2-1-15 of the first example shown in FIG. 6, so an explanation will not be repeated.

In the third example, after the atmospheres in the liquid processing bath and chamber are isolated from each other in STEP 2-3-8, the supply of IPA vapor is started without stopping the supply of water vapor to the chamber 5 (STEP 2-3-9), and the supply of the water vapor is stopped after that (STEP 2-3-10). The supply of the water vapor is preferably stopped by gradually reducing the supply amount.

Figure 9:
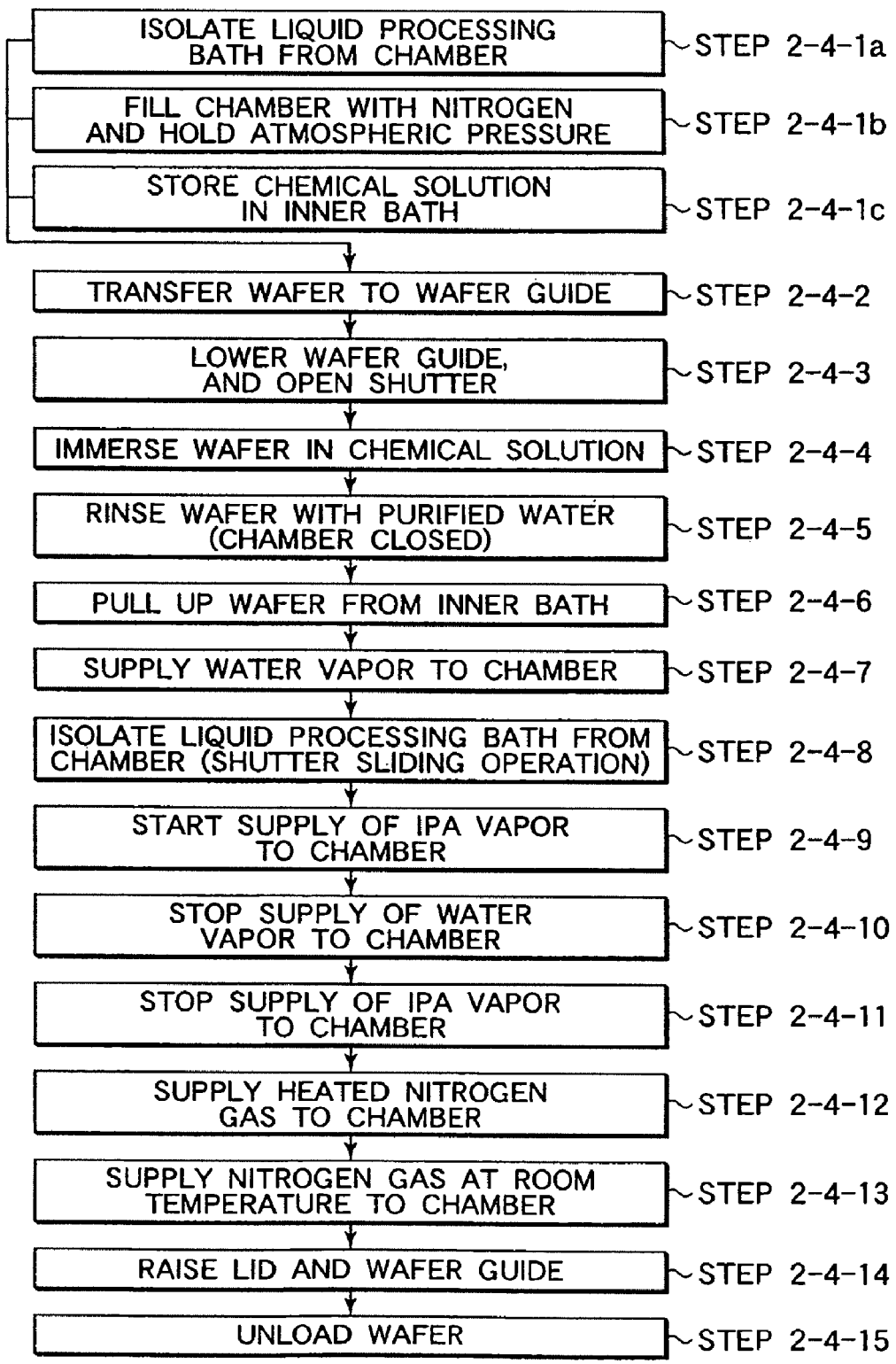
FIG. 9 This is a flowchart showing a fourth example of the second wafer cleaning method performed by the substrate processing apparatus shown in FIG. 1.

A fourth example of the second cleaning method will be explained below. FIG. 9 is a flowchart showing the fourth example of the second cleaning method. In the fourth example shown in FIG. 9, the order of STEP 2-2-9 and STEP 2-2-10 is changed in the second example shown in FIG. 7. Therefore, steps from STEP 2-4-1$a$ to STEP 2-4-8 and from STEP 2-4-11 to STEP 2-4-15 shown in FIG. 9 are the same as the steps from STEP 2-2-1$a$ to STEP 2-2-8 and from STEP 2-2-11 to STEP 2-2-15 of the second example shown in FIG. 7, so a repetitive explanation will be omitted.

In the fourth example, after the atmospheres in the liquid processing bath and chamber are isolated from each other in STEP 2-4-8 (or after a predetermined time has elapsed since the supply of water vapor to the chamber 5 is started, if STEP 2-4-7 and STEP 2-4-8 are performed in the reverse order), the supply of IPA vapor is started without stopping the supply of water vapor to the chamber 5 (STEP 2-4-9), and the supply of the water vapor is stopped after that (STEP 2-4-10). The supply of the water vapor is preferably stopped by gradually reducing the supply amount.

When the wafers W are processed by using the third and fourth examples, as in the first and second examples, the liquid film on the surface of each wafer W can be gradually changed into an IPA film. In addition, the IPA film can be dried substantially simultaneously over the wafer surface by supplying IPA vapor substantially simultaneously onto the wafer surface. This makes it possible to suppress the formation of a watermark, and effectively prevent the occurrence of pattern fall.

A substrate processing apparatus according to another embodiment of the present invention will be explained below.

Figure 10:
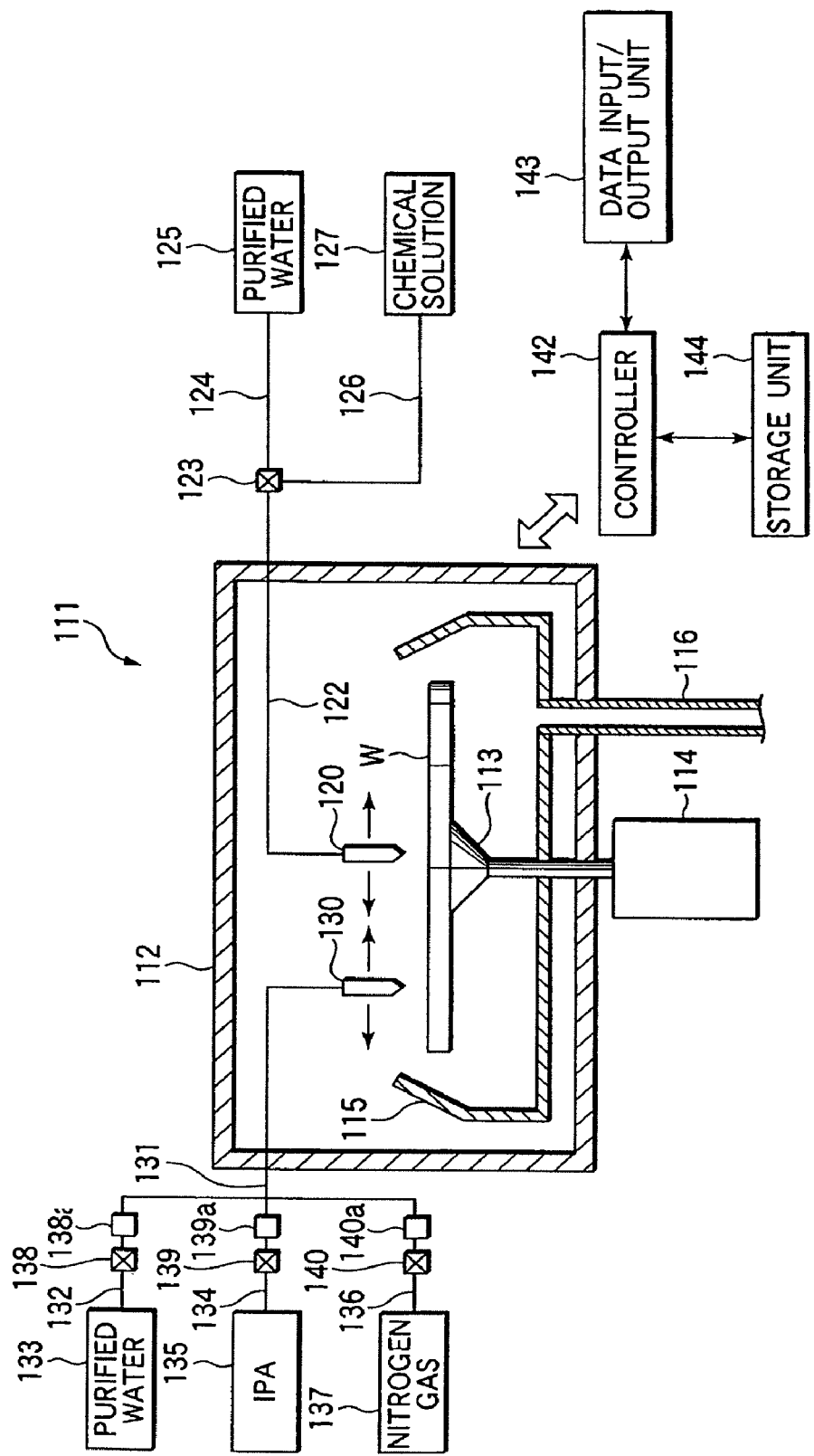
FIG. 10 This is a schematic view showing an outline of the arrangement of a substrate processing apparatus according to another embodiment of the present invention.

In this embodiment, an example in which the present invention is applied to a single substrate cleaning apparatus will be explained. FIG. 10 is a schematic view showing the arrangement of the substrate processing apparatus according to the other embodiment of the present invention. A substrate processing apparatus 111 has a chamber 112, and a spin chuck 113 for horizontally holding a semiconductor wafer W as a substrate by suction is disposed in the chamber 112. A motor 114 can rotate the spin chuck 113. A cup 115 is also disposed in the chamber 112 so as to cover the wafer W held by the spin chuck 113. An exhaust/drain pipe 116 for exhaust and drain is connected to the bottom of the cup 115 so as to extend downward from the chamber 112.

A process liquid supply nozzle 120 movable by a driving mechanism (not shown) is disposed above the wafer W held by the spin chuck 113. The process liquid supply nozzle 120 is connected to a process liquid supply pipe 122 having a switching valve 123. The switching valve 123 is connected to a pipe 124 extending from a purified water supply source 125, and a pipe 126 extending from a chemical solution supply source 127. One of a chemical solution and purified water (DIW) can be delivered onto the wafer W by operating the switching valve 123. The chemical solution or purified water (DIW) is supplied onto the wafer W while it is rotated by the motor 114. As in the above embodiment, examples of the chemical solution are an aqueous dilute hydrofluoric acid solution (DHF), ammonia-hydrogen peroxide solution (APF), and sulfuric acid-hydrogen peroxide solution (SPM). After a cleaning process is performed using any of these chemical solutions, a rinsing process is performed using purified water (DIW). Note that the process liquid supply nozzle 120 can scan over the wafer W during the chemical solution processing and rinsing process.

A cleaning/drying nozzle 130 movable by a driving mechanism (not shown) is disposed above the wafer W. The cleaning/drying nozzle 130 is connected to a pipe 131. The pipe 131 is connected to a pipe 132 extending from a purified water supply source 133, a pipe 134 extending from an IPA supply source 135, and a pipe 136 extending from a nitrogen gas supply source 137 for supplying high-temperature nitrogen gas. The pipes 132, 134, and 136 respectively have switching valves 138, 139, and 140 and flow control valves 138a, 139a, and 140a. Accordingly, it is possible to select one of purified water, IPA, and nitrogen gas to be delivered, and control the flow rate of the selected material. A predetermined one of these materials is supplied at a predetermined flow rate through the pipe 131 and delivered onto the wafer W from the cleaning/drying nozzle 130. Note that similar to the process liquid supply nozzle 120, the cleaning/drying nozzle 130 can also scan over the wafer W.

More specifically, the wafer W being rotated by the motor 114 is cleaned by supplying purified water onto the wafer W from the cleaning/drying nozzle 130. After that, the wafer W is dried by supplying a fluid mixture prepared by mixing IPA and purified water at a predetermined ratio, and supplying high-temperature nitrogen gas.

A controller (process controller) 142 controls, e.g., the driving of various mechanisms (e.g., the motor 114 and nozzle driving mechanisms), and the switching valves, when the wafer W is processed in the substrate processing apparatus 111. The controller 142 is connected to a keyboard with which the process manager inputs commands and the like to manage the substrate processing apparatus 111, and a data input/output unit 143 such as a display that visually displays the operation status of the substrate processing apparatus 111.

The controller 142 is also connected to a storage unit 144 storing a control program for implementing various processes executed by the substrate processing apparatus 111 under the control of the controller 142, and programs (i.e., recipes) for allowing the individual components of the substrate processing apparatus 111 to execute processes in accordance with the process conditions. The recipes can be stored in a hard disk, semiconductor memory, or the like, and can also be set in a predetermined position of the storage unit 144 as they are stored in a computer readable portable storage medium such as a CD-ROM or DVD-ROM. It is also possible to appropriately transmit the recipes from another apparatus through, e.g., a dedicated line.

In accordance with, e.g., an instruction from the data input/output unit 143, the controller 142 reads out a given necessary recipe from the storage unit 144 and executes the readout recipe. In this manner, the substrate processing apparatus 111 performs desired processing under the control of the controller 142.

The substrate processing apparatus constructed as above can perform the first cleaning method described previously. When performing this method, the wafer W to be cleaned is first placed on the spin chuck 113. Then, the process liquid supply nozzle 120 is moved to a position immediately above the center of the wafer W. While the wafer W is rotated by the motor 114, a predetermined chemical solution is supplied onto the wafer W from the chemical solution supply source 127 via the pipe 126 and process liquid supply nozzle 120, thereby cleaning the wafer W. After the cleaning process is complete, the pipe 126 is switched to the pipe 124 by the switching valve 123, with the wafer W being kept rotated, and purified water is supplied onto the wafer W via the process liquid supply nozzle 120, thereby rinsing the wafer W. During the cleaning process and rinsing process, the process liquid supply nozzle 120 preferably scans over the wafer W.

After the rinsing process is complete, the process liquid supply nozzle 120 is retracted, the cleaning/drying nozzle 130 is moved to a position above the wafer W, and the switching valve 138 is opened to supply purified water onto the wafer W from the purified water supply source 133 via the pipes 132 and 131 and the cleaning/drying nozzle 130, thereby rinsing the wafer W. After that, the switching valve 139 is opened, and a fluid mixture obtained by mixing purified water and IPA supplied from the purified water supply source 133 and IPA supply source 135 via the flow control valves 138a and 139a, respectively, is delivered onto the wafer W from the cleaning/drying nozzle 130. In this case, the cleaning/drying nozzle 130 favorably scans over the wafer W.

As in the embodiment described earlier, drying the wafer W by using the mixture of IPA and purified water makes it possible to decrease the change in surface tension between patterns, and effectively prevent pattern fall. The effect is notable especially when the IPA concentration in the fluid mixture is changed. For example, it is possible to use a sequence in which the wafer W is cleaned with purified water, the IPA concentration in the fluid mixture is initially set at a low concentration (e.g., 20%), this low-concentration IPA fluid mixture is supplied onto the wafer W in rotation while the cleaning/drying nozzle 130 is scanned, the cleaning/drying nozzle 130 is returned to the center of the wafer W, the IPA concentration in the fluid mixture is set at a high concentration (e.g., 100%), and this high-concentration IPA fluid mixture is supplied onto the wafer W in rotation while the cleaning/drying nozzle 130 is scanned. It is also possible to further effectively prevent pattern fall by gradually or continuously changing the IPA concentration in the fluid mixture by finely changing the steps of the IPA concentration. In this case, as in the previous embodiment, the IPA concentration in the fluid mixture is preferably initially 40% or less, and finally 90% or more.

After these processes performed using IPA and purified water as described above, high-temperature nitrogen gas is supplied onto the wafer W from the nitrogen gas supply source 137 via the cleaning/drying nozzle 130, thereby finally drying the wafer W.

Note that the present invention is not limited to the above embodiments, and can be variously modified. For example, water vapor and IPA vapor are supplied to the chamber 5 in the first embodiment, but it is also possible to supply mist of purified water instead of the water vapor and mist of IPA instead of the IPA vapor to the chamber 5. In this case, a nozzle capable of spraying a liquid in the form of mist need only be used as the fluid nozzle 71, and it is possible to use a nozzle that forms mist of purified water or IPA by using the gas pressure of nitrogen gas or the like. Also, another volatile organic solvent can be used instead of IPA. Examples are ketones such as acetone and diethylketone, ethers such as methyl ether, and alcohols such as methyl alcohol and ethyl alcohol.

Furthermore, the substrate processing apparatus 1 has the structure in which the atmospheres in the liquid processing bath 6 and chamber 5 can be isolated from each other and can communicate with each other by the shutter 10. However, the shutter 10 is not always necessary; even an apparatus having no shutter 10 can use the methods described above for processing a wafer W. In the first embodiment, the apparatus in which the liquid processing unit and drying unit are discrete units has been explained. However, the present invention is also effective for a substrate processing apparatus in which the liquid processing unit and drying unit are integrated, i.e., after a substrate is cleaned in the liquid processing bath, the cleaning liquid is drained, and a volatile organic solvent is supplied into the liquid processing bath, thereby performing cleaning and drying. In this case, purified water in the liquid processing bath is drained after a substrate is cleaned, and a fluid mixture of a volatile organic solvent such as IPA and purified water is supplied to the liquid processing bath. The rest of the arrangement can be the same as that of the substrate processing apparatus shown in FIG. 1.

In the third and fourth examples of the second cleaning method described above, IPA vapor is supplied after the wafer W is held in a predetermined position of the chamber 5 with water vapor being supplied. However, the supply of the IPA vapor may also be started while the wafer W is pulled up, provided that water vapor is supplied to the chamber 5. While the wafer W is pulled up, leakage of the IPA vapor from the chamber 5 can be prevented by performing exhaust from the exhaust pipe 66 of the local exhaust device 8.

The present invention is not limitedly applied to a cleaning process using a chemical solution, but also applicable to a wet etching process and the like. In addition, the above embodiments are exemplified by a case where the present invention is applied to a semiconductor wafer, but the present invention is not limited to a semiconductor substrate, and can also be applied to other substrates such as a glass substrate for a liquid crystal display, a printed circuit board, and a ceramic substrate. Furthermore, the scope of the present invention also includes appropriate combinations of the constituent elements of the above embodiments, or forms obtained by excluding some of the constituent elements of the above embodiments, as long as the combinations or forms do not depart from the scope of the present invention.

INDUSTRIAL APPLICABILITY

The present invention is suited to an apparatus, such as a cleaning apparatus or etching apparatus for various substrates such as a semiconductor wafer, which performs liquid processing on a substrate, and performs a rinsing process and drying process on the substrate after that.

The invention claimed is:

1. A substrate processing method for processing a single substrate having a predetermined circuit pattern formed thereon by photolithography, the method comprising:
   horizontally holding the substrate on a holder rotatable with the substrate;
   performing a rinsing process by supplying purified water onto a surface of the substrate rotated by the holder;
   performing a drying process by supplying a fluid mixture consisting essentially of purified water and a volatile organic solvent from a drying nozzle to the surface of the substrate rotated by the holder to dry the substrate after the rinsing process; and
   performing a ratio control operation during the drying process such that a ratio of a concentration of the volatile organic solvent relative to a concentration of the purified water in the fluid mixture continuously or gradually rises with time.

2. The method according to claim 1, wherein the ratio control operation is performed during the drying process such that the concentration of the volatile organic solvent in the fluid mixture is initially not more than 40% and finally not less than 90%.

3. The method according to claim 1, wherein the drying process includes moving the drying nozzle to scan over the substrate, while supplying the fluid mixture from the drying nozzle.

4. The method according to claim 1, wherein the drying process further includes supplying an inert gas through the drying nozzle onto the substrate held on the holder.

5. The method according to claim 4, wherein the drying process sets the inert gas at a high temperature while supplying the inert gas.

6. The method according to claim 1, wherein the volatile organic solvent is selected from the group consisting of ketones, ethers, and alcohols.

7. The method according to claim 6, wherein the volatile organic solvent is isopropyl alcohol.

8. The method according to claim 1, wherein the method further comprises performing a liquid process by supplying a chemical solution onto the substrate held on the holder, before the rinsing process.

9. The method according to claim 1, wherein the fluid mixture is prepared by a mixing portion that mixes the purified water and the volatile organic solvent, and the ratio control operation includes adjusting a flow rate of one or both of the purified water and the volatile organic solvent supplied to the mixing portion.

10. A computer readable non-transitory storage medium storing a control program, wherein the control program, when executed, causes a computer to control a substrate processing apparatus to conduct the method according to claim 1.

* * * * *